(12) United States Patent
Moon et al.

(10) Patent No.: US 12,279,502 B2
(45) Date of Patent: Apr. 15, 2025

(54) DISPLAY DEVICE AND METHOD OF MANUFACTURING DISPLAY DEVICE

(71) Applicant: Samsung Display Co., Ltd., Yongin-Si (KR)

(72) Inventors: Youngmin Moon, Yongin-si (KR); Jeongkuk Kim, Yongin-si (KR); Kyuhwan Hwang, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 274 days.

(21) Appl. No.: 16/806,843

(22) Filed: Mar. 2, 2020

(65) Prior Publication Data

US 2020/0411605 A1 Dec. 31, 2020

(30) Foreign Application Priority Data

Jun. 28, 2019 (KR) .................... 10-2019-0078337

(51) Int. Cl.
*H10K 59/35* (2023.01)
*H10K 59/00* (2023.01)
*H10K 59/126* (2023.01)
*H10K 59/12* (2023.01)

(52) U.S. Cl.
CPC ......... *H10K 59/353* (2023.02); *H10K 59/00* (2023.02); *H10K 59/126* (2023.02); *H10K 59/1201* (2023.02)

(58) Field of Classification Search
CPC ........ H01L 27/3216–3218; H10K 59/351–353
See application file for complete search history.

(56) References Cited

U.S. PATENT DOCUMENTS

| | | | |
|---|---|---|---|
| 9,490,311 B2 | 11/2016 | Park et al. |
| 9,847,486 B2 | 12/2017 | Park et al. |
| 9,911,941 B2 | 3/2018 | Choi et al. |
| 10,209,406 B2 | 2/2019 | Ji et al. |
| 11,355,707 B2 | 6/2022 | Bai et al. |

(Continued)

FOREIGN PATENT DOCUMENTS

| | | |
|---|---|---|
| CN | 108866476 A | 11/2018 |
| JP | 2011-096378 A | 5/2011 |

(Continued)

*Primary Examiner* — Eric K Ashbahian
(74) *Attorney, Agent, or Firm* — Innovation Counsel LLP

(57) ABSTRACT

A display device includes: a substrate including a first display area and a second display area, the second display area including transmissive areas; first opposite electrodes spaced apart from each other over the substrate; and second opposite electrodes including an overlapping portion that overlaps the first opposite electrodes over the substrate, the second opposite electrodes being spaced apart from each other, wherein connection opposite electrodes, in which the first opposite electrodes and the second opposite electrodes are connected by the overlapping portion in the second display area, are alternately arranged with the transmissive areas, each of the first opposite electrodes is arranged to correspond to a first pixel area including a plurality of sub-pixels, and each of the second opposite electrodes is arranged to correspond to a second pixel area neighboring the first pixel area and including a plurality of sub-pixels.

10 Claims, 22 Drawing Sheets

(56) References Cited

U.S. PATENT DOCUMENTS

| | | | | |
|---|---|---|---|---|
| 2014/0242737 A1* | 8/2014 | Chung | ................ | H01L 51/5221 |
| | | | | 118/504 |
| 2016/0322595 A1* | 11/2016 | Choi | .................. | H01L 27/3216 |
| 2018/0019439 A1* | 1/2018 | Lee | ..................... | H01L 51/5253 |
| 2018/0190942 A1* | 7/2018 | Song | .................. | H01L 51/5275 |
| 2019/0148680 A1 | 5/2019 | Xin et al. | | |
| 2019/0196635 A1 | 6/2019 | Park et al. | | |
| 2019/0206953 A1* | 7/2019 | Hsieh | ................. | H01L 51/5234 |
| 2019/0237514 A1 | 8/2019 | Tsukamoto et al. | | |
| 2020/0052055 A1* | 2/2020 | Song | .................. | H10K 59/1213 |
| 2020/0075704 A1* | 3/2020 | Liu | ......................... | H10K 71/00 |
| 2020/0105844 A1* | 4/2020 | Wang | .................. | H10K 59/126 |
| 2020/0280009 A1* | 9/2020 | Lin | ........................ | H10K 71/00 |
| 2020/0312832 A1* | 10/2020 | Chi | ..................... | H01L 27/3218 |
| 2020/0357863 A1* | 11/2020 | Nakamura | ............ | G06F 1/1643 |
| 2020/0395422 A1* | 12/2020 | Xu | ........................ | H10K 71/00 |

FOREIGN PATENT DOCUMENTS

| | | |
|---|---|---|
| JP | 2011-187431 A | 9/2011 |
| KR | 10-2012-0052206 A | 5/2012 |
| KR | 10-2014-0107928 A | 9/2014 |
| KR | 10-2016-0130042 A | 11/2016 |
| KR | 10-2018-0050473 A | 5/2018 |
| KR | 10-2018-0073123 A | 7/2018 |
| WO | 2018-021170 A1 | 2/2018 |

* cited by examiner

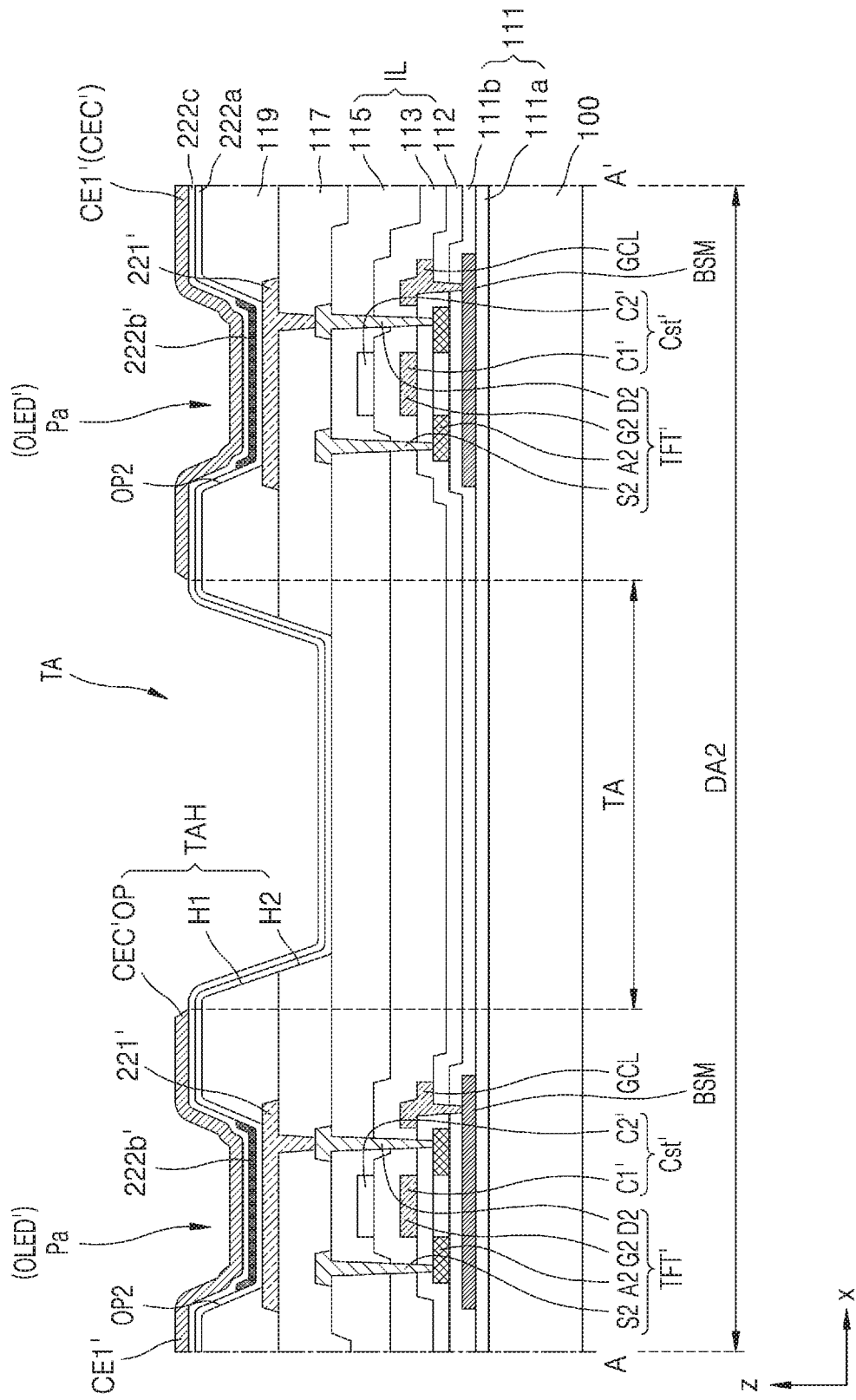

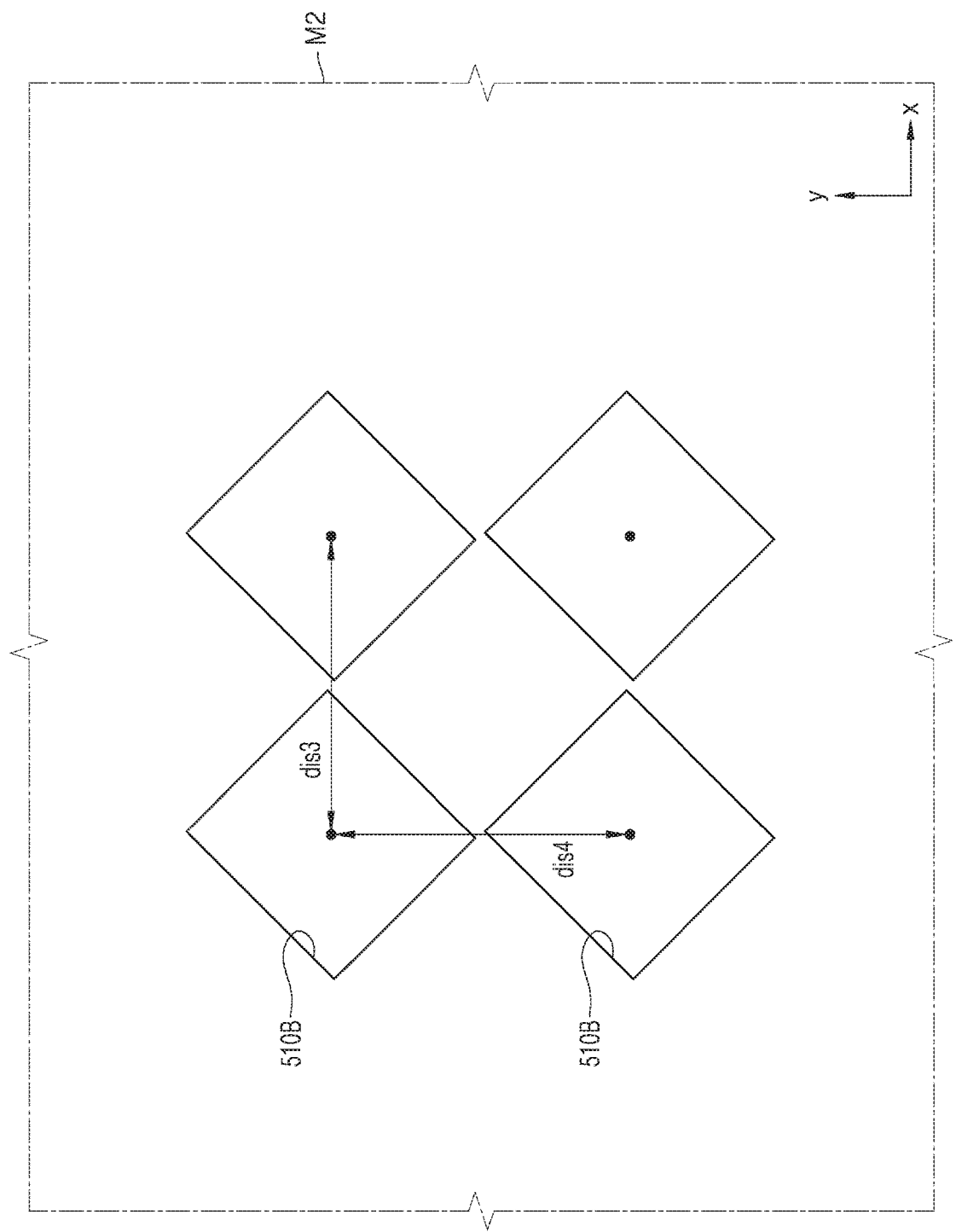

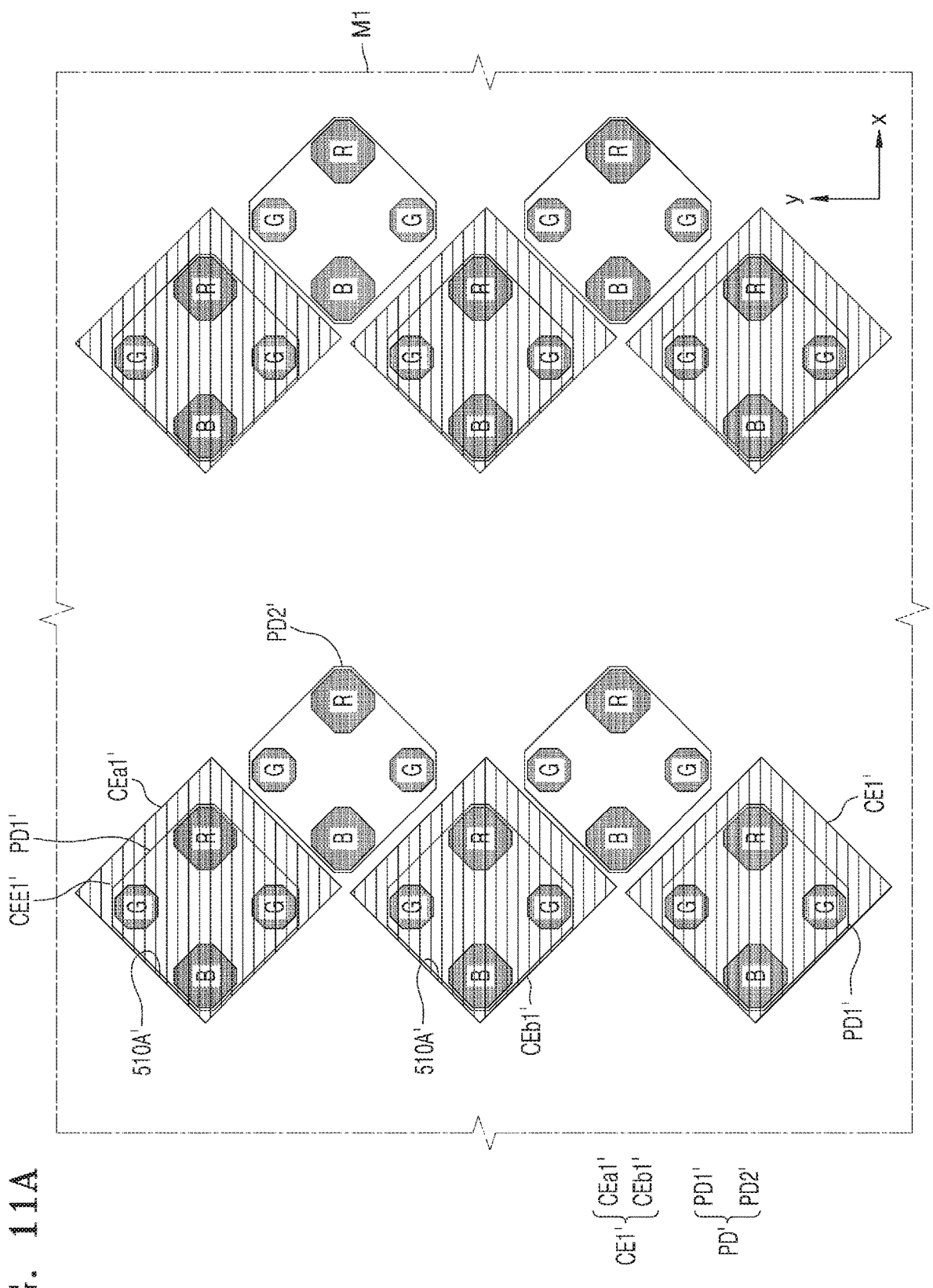

DISPLAY DEVICE AND METHOD OF MANUFACTURING DISPLAY DEVICE

CROSS-REFERENCE TO RELATED APPLICATION

This application claims the benefit of Korean Patent Application No. 10-2019-0078337, filed on Jun. 28, 2019, in the Korean Intellectual Property Office, the disclosure of which is incorporated herein in its entirety by reference.

FIELD

One or more embodiments relate to a display device and a method of manufacturing the display device.

DESCRIPTION OF RELATED ART

Display devices often display images through pixels. Display devices may also include an infrared sensor in a bezel (or an edge portion) of a front surface (e.g. one surface on which an image is displayed) of the display device, and recognize an object by using the infrared sensor.

As the bezels of display devices become thinner, a user may be able to more easily fix their eyes on or concentrate on an image or screen of the display device). Recently, research and development has been carried out on entire surface display technologies in which a bezel on a front surface of a display device is removed, an infrared sensor arranged on the front surface (or the bezel) is rearranged, and an image is displayed on the entire front surface of the display device.

SUMMARY

One or more embodiments include a display device including a sensor area in which a sensor, etc. may be arranged while displaying an image. However, it should be understood that embodiments described herein should be considered in an illustrative sense only and not exclude other alternative embodiments in the spirit of the disclosure from the scope of the disclosure.

Additional aspects will be set forth in part in the description which follows and, in part, will be apparent from the description, or may be learned by practice of the presented embodiments of the disclosure.

According to one or more embodiments, a display device includes: a substrate including a first display area and a second display area, the second display area including transmissive areas; first opposite electrodes spaced apart from each other over the substrate; and second opposite electrodes respectively including overlapping portions that overlap the first opposite electrodes over the substrate, the second opposite electrodes being spaced apart from each other, wherein connection opposite electrodes, in which the first opposite electrodes are connected to the second opposite electrodes by the overlapping portion in the second display area, are alternately arranged with the transmissive areas, each of the first opposite electrodes is arranged to correspond to a first pixel area including a plurality of sub-pixels, and each of the second opposite electrodes is arranged to correspond to a second pixel area neighboring the first pixel area and including a plurality of sub-pixels.

The overlapping portion may include a first overlapping portion and a second overlapping portion, a first central opposite electrode, which is one of the first opposite electrodes, may overlap a second central opposite electrode, which is one of the second opposite electrodes, in the first overlapping portion, and the second central opposite electrode may overlap a first peripheral opposite electrode, which is another of the first opposite electrodes, in the second overlapping portion.

An extension line of the first overlapping portion in a lengthwise direction may intersect with an extension line of the second overlapping portion in a lengthwise direction.

The first overlapping portion may contact the second overlapping portion.

An extension line of the first overlapping portion in a lengthwise direction may be parallel to an extension line of the second overlapping portion in a lengthwise direction.

The overlapping portion may further include a third overlapping portion, and the first peripheral opposite electrode may overlap a second peripheral opposite electrode, which is another of the second opposite electrodes, in the third overlapping portion.

The overlapping portion may include a second overlapping portion and a third overlapping portion, a second central opposite electrode, which is one of the second opposite electrodes, may overlap a first peripheral opposite electrode, which is one of the first opposite electrodes, in the second overlapping portion, and the first peripheral opposite electrode may overlap a second peripheral opposite electrode, which is another of the second opposite electrodes, in the third overlapping portion.

The first pixel area and the second pixel area may constitute a virtual quadrangle, the plurality of sub-pixels may include a first sub-pixel, a second sub-pixel, and a third sub-pixel emitting light of different colors and may be respectively arranged at vertexes of the virtual quadrangle, and the second sub-pixels may face each other around a center of the virtual quadrangle.

The first pixel area and the second pixel area may constitute a virtual quadrangle, the plurality of sub-pixels may include a first sub-pixel, a second sub-pixel, and a third sub-pixel emitting light having different colors and may be respectively arranged at vertexes of the virtual quadrangle, and the first sub-pixel may face the third sub-pixel around a center of the virtual quadrangle.

The first pixel area and the second pixel area may be each surrounded by the overlapping portion in the first display area.

An interval between the first opposite electrodes neighboring each other and arranged in a first direction in the first display area may be different from an interval between the first opposite electrodes neighboring each other and arranged in the first direction in the second display area.

According to one or more embodiments, a method of manufacturing a display device includes: preparing a substrate including a first display area and a second display area, the second display area including transmissive areas; forming first opposite electrodes by using a first mask including first openings spaced apart from each other; and forming second opposite electrodes including an overlapping portion that overlaps the first opposite electrodes by using a second mask including second openings spaced apart from each other, wherein connection opposite electrodes, in which the first opposite electrodes are connected to the second opposite electrodes by the overlapping portion in the second display area, are alternately arranged with the transmissive areas, each of the first opposite electrodes is arranged to correspond to a first pixel area including a plurality of sub-pixels, and each of the second opposite electrodes is arranged to correspond to a second pixel area neighboring the first pixel area and including a plurality of sub-pixels.

The overlapping portion may include a first overlapping portion and a second overlapping portion, a first central opposite electrode, which is one of the first opposite electrodes, may overlap a second opposite electrode, which is one of the second opposite electrodes, in the first overlapping portion, and the second opposite electrode may overlap a first peripheral opposite electrode, which is another of the first opposite electrodes, in the second overlapping portion.

An extension line of the first overlapping portion in a lengthwise direction may intersect with an extension line of the second overlapping portion in a lengthwise direction.

An extension line of the first overlapping portion in a lengthwise direction may be parallel to an extension line of the second overlapping portion in a lengthwise direction.

The overlapping portion may further include a third overlapping portion, and the first peripheral opposite electrode may overlap a second peripheral opposite electrode, which is another of the second opposite electrodes, in the third overlapping portion.

A shape of the first openings and a shape of the second openings may be each a rectangular shape including a long side and a short side, and the shape of the first openings may be different from the shape of the second openings.

A shape of the first openings and a shape of the second openings may be each a rectangular shape including a long side and a short side, and the shape of the first openings may be the same as the shape of the second openings.

The first pixel area and the second pixel area may constitute a virtual quadrangle, the plurality of sub-pixels may include a first sub-pixel, a second sub-pixel, and a third sub-pixel emitting light of different colors and may be respectively arranged at vertexes of the virtual quadrangle, the second sub-pixels may face each other around a center of the virtual quadrangle, and the first sub-pixel may face the third sub-pixel around the center of the virtual quadrangle.

An interval between the first opposite electrodes neighboring each other and arranged in a first direction in the first display area may be different from an interval between the first opposite electrodes neighboring each other and arranged in the first direction in the second display area.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 6B is a cross-sectional view of a display device according to another embodiment;

FIG. 8B is a plan view of an example of a second mask for forming an opposite electrode in a first display area according to an embodiment;

FIG. 11A is a plan view of a manufacturing method of forming an opposite electrode in a second display area by using a first mask according to an embodiment;

DETAILED DESCRIPTION

Figure 1A:
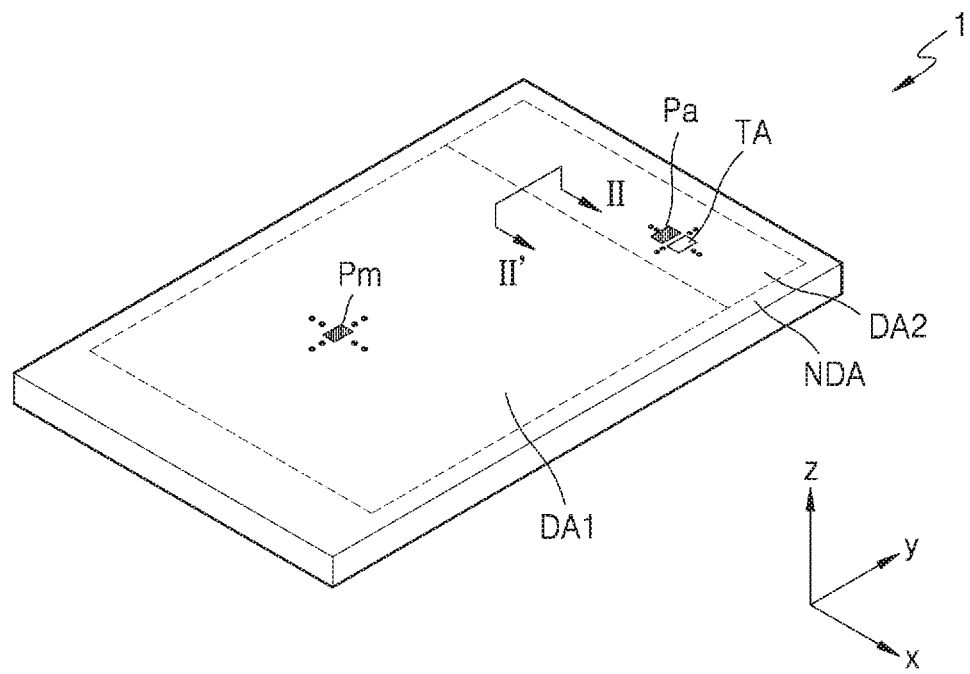
FIG. 1A is a perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the disclosure allows for various changes and numerous embodiments, example embodiments will be illustrated in the drawings and described in detail in the written description. Effects and characteristics of present embodiments, and a method of accomplishing them will be apparent by referring to content described below in detail together with the drawings. However, the present embodiments are not limited to exemplary embodiments below and may be implemented in various forms.

Hereinafter, the present embodiments are described in detail with reference to the accompanying drawings. In the drawings, the same reference numerals are given to the same or corresponding elements, and repeated description thereof is omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Figure 1B:
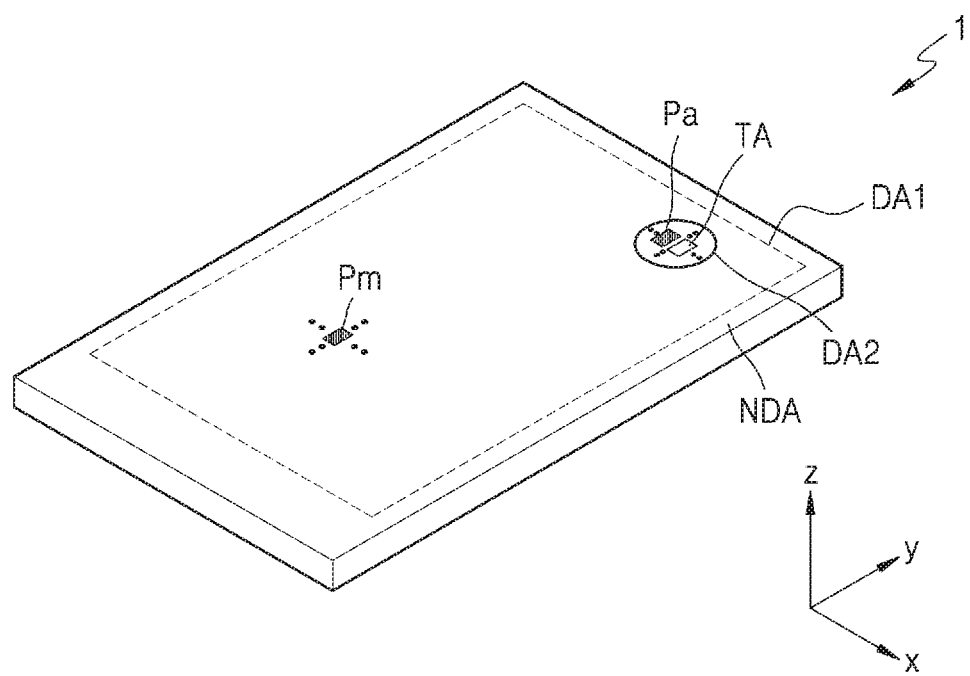
FIG. 1B is a perspective view of a display device according to another embodiment.

FIG. 1A is a perspective view of a display device 1 according to an embodiment. FIG. 1B is a perspective view of the display device 1 according to another embodiment.

Referring to FIG. 1A, the display device 1 includes a first display area DA1 and a second display area DA2 in which an image is displayed, and a non-display area NDA in which an image is not displayed. The display device 1 may display a main image by using light emitted from a plurality of main pixels Pm arranged in the first display area DA1.

As described below with reference to FIG. 2, the second display area DA2 may be an area in which a component such as a sensor that uses infrared light, visible light, or sound is arranged therebelow. The second display area DA2 may include a transmission area TA through which light and/or sound, which are output from the component to the outside or propagate toward the component from the outside, may pass. In an embodiment, in the case where infrared light passes through the second display area DA2, an infrared transmittance of the entire second display area DA2 may be 15% or more, more preferably 20% or more, 25% or more, 85% or more, or 90% or more.

In the present embodiment, a plurality of auxiliary pixels Pa may be arranged in the second display area DA2. The display device may display a predetermined image by using light emitted from the auxiliary pixels Pa. An image displayed on the second display area DA2 is an auxiliary image and may have a resolution less than that of an image displayed on the first display area DA1. That is, since the second display area DA2 includes the transmissive area TA that may transmit light and/or sound, the number of auxiliary pixels Pa that may be arranged per unit area may be less than the number of main pixels Pm that may be arranged per unit area in the first display area DA1.

The second display area DA2 may be at least partially surrounded by the first display area DA1. In an embodiment, it is shown in FIG. 1A that the second display area DA2 is arranged on one side of the first display area DA1. However, as shown in FIG. 1A, a length of the second display area DA2 in a y-direction is not limited. The length in the y-direction may be smaller. Various modifications may be made.

In FIG. 1B, the same reference numerals as those of FIG. 1A denote the same members, and repeated description thereof is omitted for brief description.

Referring to FIG. 1B, the second display area DA2 may be entirely surrounded by the first display area DA1. Though it is shown in FIG. 1B that the second display area DA2 is arranged on one side (a top right side) of the first display area DA1, which is a quadrangle, the embodiment is not limited thereto. The shape of the first display area DA1 may include a circle, an ellipse, or a polygon such as a triangle or a pentagon. The location and the number of second display areas DA2 may be variously changed.

Though the display device 1 according to an embodiment is described as an organic light-emitting display device as an example, a display device according to the present disclosure is not limited thereto. In another embodiment, the display device 1 according to the present disclosure may be various other types, for example, an inorganic light-emitting display apparatus and a quantum dot light-emitting display apparatus.

Figure 2:
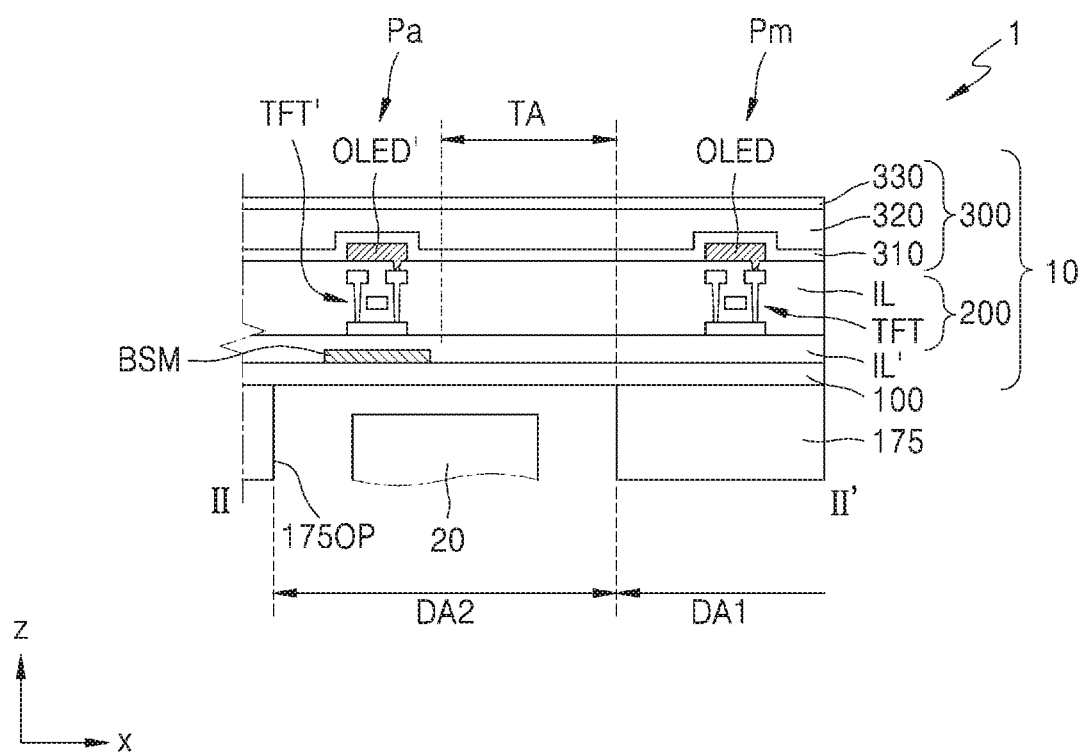
FIG. 2 is a cross-sectional view of a display device according to an embodiment.

FIG. 2 is a cross-sectional view of the display device 1 according to an embodiment and may correspond to a cross-section taken along line II-II' of FIG. 1A.

Referring to FIG. 2, the display device 1 may include a display panel 10 including a display element, and a component 20 corresponding to the second display area DA2.

The display panel 10 may include a substrate 100, a display element layer 200, and a thin-film encapsulation layer 300, the display element layer 200 being arranged over the substrate 100, and the thin-film encapsulation layer 300 sealing the display element layer 200 as a sealing member. Also, the display panel 10 may further include a lower protective film 175 arranged under the substrate 100.

The substrate 100 may include glass or a polymer resin. In the case where the substrate 100 includes a polymer resin, the substrate 100 may be flexible, rollable, or bendable. The substrate 100 may have a multi-layered structure including a layer including a polymer resin and an inorganic layer (not shown).

The display element layer 200 may include a circuit layer, an organic light-emitting diode OLED as a display element, and insulating layers IL and IL' therebetween, the circuit layer including thin film transistors TFT and TFT'.

Also, a transmissive area TA may be arranged in the second display area DA2, the auxiliary thin film transistor TFT' and a display element not being arranged in the transmissive area TA. It may be understood that the transmissive area TA is an area that transmits light/signals emitted from the component 20 or light/signals incident to the component 20.

The component 20 may be located in the second display area DA2. The component 20 may include an electronic element that uses light or sound. For example, the component 20 may be a sensor such as an infrared sensor that emits and/or receives light, a sensor that outputs and senses light or sound to measure a distance or recognize a fingerprint, a small lamp that outputs light, or a speaker that outputs sound. An electronic element that uses light may use light in various wavelength bands such as visible light, infrared light, and ultraviolet light. The component 20 arranged in the second display area DA2 may be provided as a plurality of components. For example, as the component 20, a light-emitting element and a light-receiving element may be provided together in the second display area DA2. Alternatively, a light emitter and a light receiver may be simultaneously provided to one component 20.

A bottom electrode layer BSM may be arranged in the second display area DA2. The bottom electrode layer BSM may be arranged to correspond to an auxiliary pixel Pa. That is, the bottom electrode layer BSM may be arranged below an auxiliary thin film transistor TFT'. That is, the bottom electrode layer BSM may prevent external light from reaching the auxiliary pixel Pa including the auxiliary thin film transistor TFT'. For example, light emitted from the component 20 may be prevented from reaching the auxiliary pixel Pa. A constant voltage or a signal may be applied to the bottom electrode layer BSM to prevent a pixel circuit from being damaged by electrostatic discharge.

The thin-film encapsulation layer 300 may include at least one inorganic encapsulation layer and at least one organic encapsulation layer. With regard to this, FIG. 2 shows first and second inorganic encapsulation layers 310 and 330, and an organic encapsulation layer 320 therebetween.

The organic encapsulation layer 320 may include a polymer-based material. For example, the organic encapsulation layer 320 may include polyethylene terephthalate (PET), polyethylene naphthalate (PEN), polycarbonate (PC), polyimide (PI), polyethylene sulfonate, polyoxymethylene, polyarylate, hexamethyldisiloxane (HMDSO), an acrylic-based resin (e.g. polymethyl methacrylate (PMMA), polyacrylic acid, etc.), or an arbitrary combination thereof.

The first and second inorganic encapsulation layers 310 and 330 may include at least one of inorganic insulating materials including aluminum oxide, titanium oxide, tantalum oxide, hafnium oxide, zinc oxide, silicon oxide, silicon nitride, and silicon oxynitride. The second inorganic encapsulation layer 330 may cover the organic encapsulation layer 320 and include silicon oxide, silicon nitride, and/or silicon oxynitride. The second inorganic encapsulation layer 330 is deposited to directly contact the first inorganic encapsulation layer 310 in an edge region of the display device 1, thereby not exposing the organic encapsulation layer 320 to the outside of the display device 1.

The lower protective film 175 may be attached on a backside of the substrate 100 to support and protect the substrate 100. The lower protective film 175 may include an opening 1750P corresponding to the second display area DA2. Since the lower protective film 175 includes the opening 1750P, a light transmittance of the second display area DA2 may be improved. The lower protective film 175 may include PET or PI. In the case where the substrate 100 includes glass, the lower protective film 175 may be omitted.

An area of the second display area DA2 may be greater than an area in which the component 20 is arranged.

Therefore, an area of the opening 1750P provided in the lower protective film 175 may not coincide with the area of the second display area DA2. For example, the area of the opening 1750P may be less than the area of the second display area DA2. In another example, the area of the opening 1750P may be the same as an area of the second display area DA2.

Though not shown, an input sensing member, a reflection prevention member, and a transparent window may be further arranged on the display panel 10, the input sensing member sensing a touch input, and the reflection prevention member including a polarizer and a retarder, or a color filter and a black matrix.

Though the present embodiment shows that the thin-film encapsulation layer 300 is used as an encapsulation member sealing the display element layer 200, the embodiment is not limited thereto. For example, as a member sealing the display element layer 200, a sealing substrate may be used, the sealing substrate being attached on the substrate 100 by sealant or frit.

Figure 3:
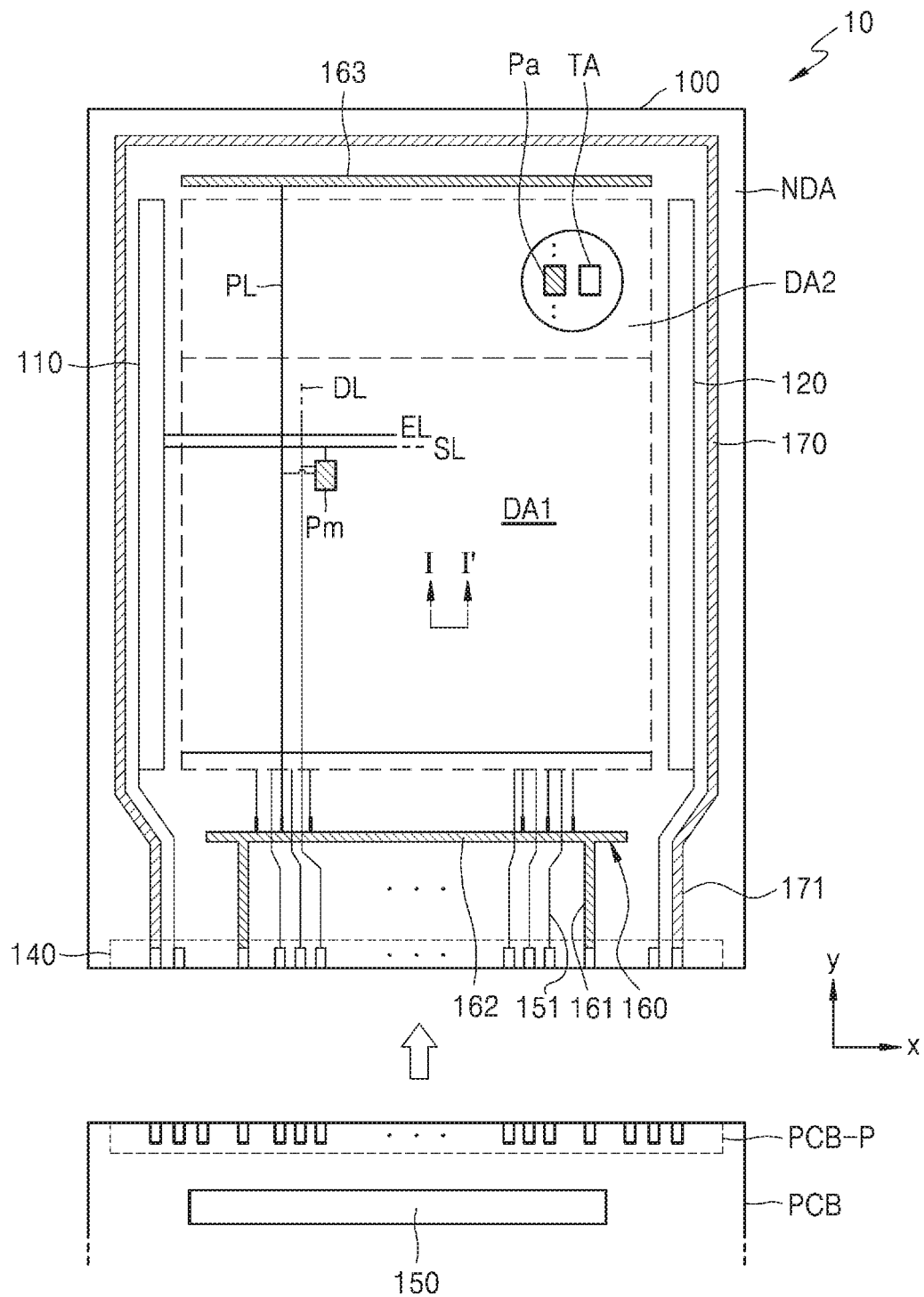
FIG. 3 is a plan view of a display device according to an embodiment.

FIG. 3 is a plan view of the display device 1 according to an embodiment.

Referring to FIG. 3, the display panel 10 includes the first display area DA1 and the second display area DA2. The first display area DA1 includes a plurality of main pixels Pm. The main pixels Pm each may include a display element such as an organic light-emitting diode. Each main pixel Pm may emit, for example, red, green, blue, or white light through an organic light-emitting diode. In the present specification, it may be understood that the main pixel Pm is a pixel that emits light of one of red, green, blue, and white colors as described above. The first display area DA1 and the second display area DA2 may be covered by the encapsulation member described with reference to FIG. 2 and thus be protected from external air or moisture.

The second display area DA2 may be arranged on one side of the first display area DA1. A plurality of auxiliary pixels Pa are arranged in the second display area DA2. The auxiliary pixels Pa each may include a display element such as an organic light-emitting diode. Each auxiliary pixel Pa may emit, for example, red, green, blue, or white light through an organic light-emitting diode. In the present specification, it may be understood that the auxiliary pixel Pa is a pixel that emits light of one of red, green, blue, and white colors as described above. The transmissive area TA may be arranged in the second display area DA2, the transmissive area TA being arranged between the auxiliary pixels Pa.

In an embodiment, a pixel circuit of one main pixel Pm may be the same as that of one auxiliary pixel Pa. However, the embodiment is not limited thereto. A pixel circuit included in the main pixel Pm may be different from a pixel circuit included in the auxiliary pixel Pa.

Since the second display area DA2 includes the transmissive area TA, a resolution of the second display area DA2 may be less than that of the first display area DA1. For example, the resolution of the second display area DA2 may be about ½ the resolution of the first display area DA1. In an embodiment, the resolution of the first display area DA1 may be 400 ppi or more, and the resolution of the second display area DA2 may be 200 ppi or more.

Each of the main and auxiliary pixels Pm and Pa may be electrically connected to peripheral circuits arranged in the non-display area NDA. A first scan driving circuit 110, a second scan driving circuit 120, a terminal 140, a data driving circuit 150, a first power supply line 160, and a second power supply line 170 may be arranged in the non-display area NDA.

The first scan driving circuit 110 may provide a scan signal to each of the main and pixels Pm and auxiliary pixels Pa through a scan line SL. The first scan driving circuit 110 may provide an emission control signal to each of the main pixels Pm and auxiliary pixels Pm through an emission control line EL. The second scan driving circuit 120 may be arranged in parallel to the first scan driving circuit 110 with the first display area DA1 and the second display area DA2 therebetween. Some of the main pixels Pm and auxiliary pixels Pa arranged in the first display area DA1 and the second display area DA2 may be electrically connected to the first scan driving circuit 110, and the rest of the main pixels Pm and auxiliary pixels Pa may be connected to the second scan driving circuit 120. In another embodiment, the second scan driving circuit 120 may be omitted.

The terminal 140 may be arranged on one side of the substrate 100. The terminal 140 may be exposed by not being covered by an insulating layer and thus be electrically connected to a printed circuit board PCB.

A terminal PCB-P of the printed circuit board PCB may be electrically connected to the terminal 140 of the display panel 10. The printed circuit board PCB transfers a signal or power of a controller (not shown) to the display panel 10. A control signal generated by the controller may be transferred to each of the first scan driving circuit 110 and the second scan driving circuit 120 through the printed circuit board PCB. The controller may provide a first power voltage ELVDD and a second power voltage ELVSS to the first power supply line 160 and the second power supply line 170, respectively, through a first connection line 161 and a second connection line 171. The first power voltage ELVDD may be provided to each of the main pixel Pm and the auxiliary pixel Pa through a driving voltage line PL connected to the first power supply line 160, and the second power voltage ELVSS may be provided to an opposite electrode of each of the main pixel Pm and the auxiliary pixel Pa connected to the second power supply line 170.

The data driving circuit 150 is electrically connected to a data line DL. A data signal of the data driving circuit 150 may be provided to each of the main pixel Pm and the auxiliary pixel Pa through a connection line 151 connected to the terminal 140 and the data line DL connected to the connection line 151. Though it is shown in FIG. 3 that the data driving circuit 150 is arranged on the printed circuit board PCB, the data driving circuit 150 may be arranged on the substrate 100. For example, the data driving circuit 150 may be arranged between the terminal 140 and the first power supply line 160.

Though it is shown in FIG. 3 that the driving voltage line PL and the data line DL are arranged in a y-direction in also the second display area DA2, the embodiment is not limited thereto. The driving voltage line PL and the data line DL may be arranged in a direction different from the y-direction in the second display area DA2 including the transmissive area TA so as not to overlap the transmissive area TA. Also, the scan line SL and the emission control line EL may be arranged so as not to overlap the transmissive area TA.

The first power supply line 160 may include a first sub-line 162 and a second sub-line 163, the first sub-line 162 and the second sub-line 163 extending in parallel to each other in an x-direction with the first display area DA1 and the second display area DA2 therebetween. The second power supply line 170 has a loop shape having one open side and may partially surround the first display area DA1 and the second display area DA2.

Figure 4:
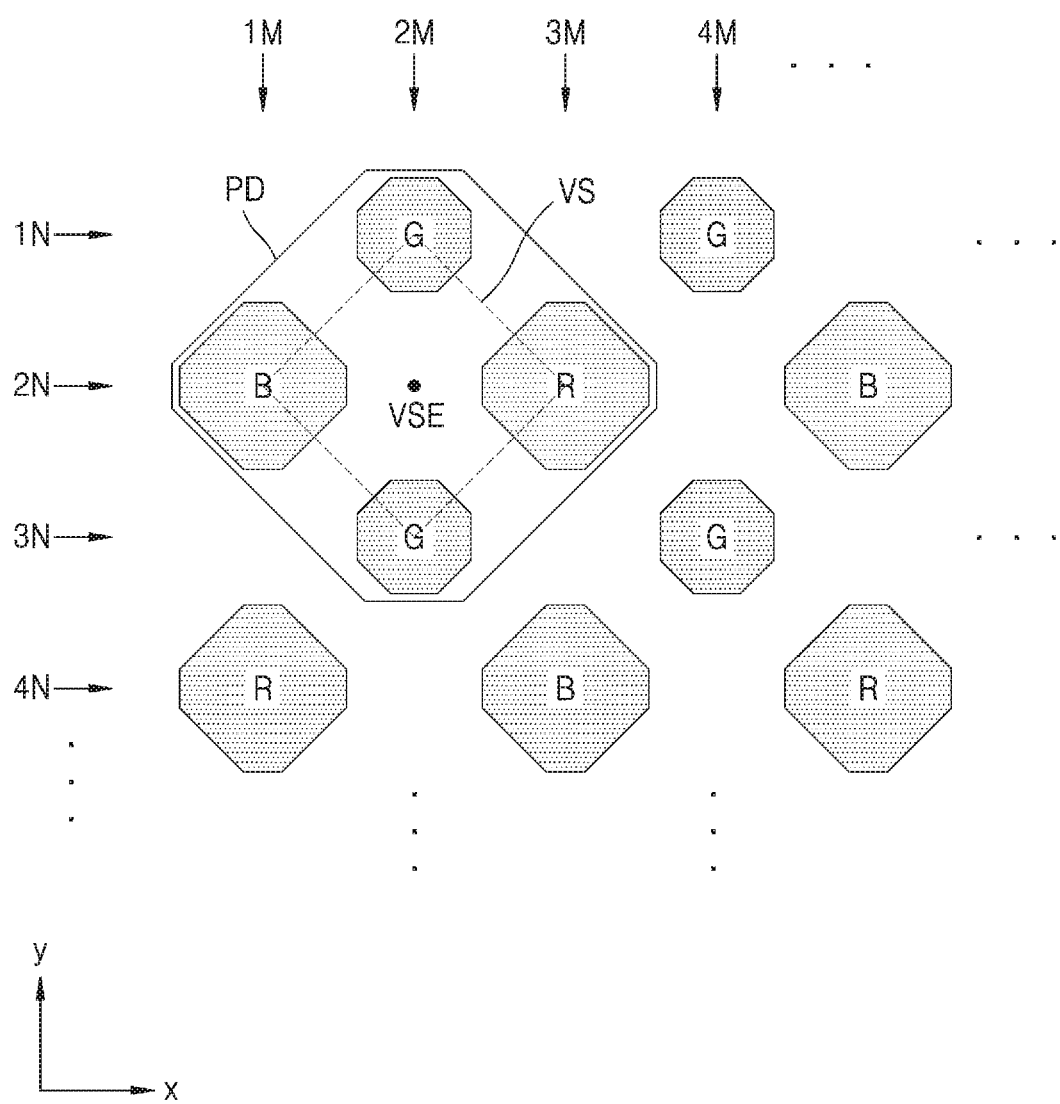
FIG. 4 is an arrangement view of a plurality of sub-pixels of a display device according to an embodiment.

FIG. 4 is an arrangement view of a plurality of sub-pixels of the display device 1 according to an embodiment. In the present embodiment, a red sub-pixel R, a green sub-pixel G, and a blue sub-pixel B represent emission areas of respective sub-pixels. The emission area may be defined by an opening of a pixel-defining layer described below.

Referring to FIG. 4, green sub-pixels G may be spaced apart from each other with a predetermined interval in a first direction (e.g. the x-direction) on a first row 1N, and a red sub-pixel R and a blue sub-pixel B may be alternately arranged in the first direction on a second row 2N neighboring the first row 1N. Likewise, green sub-pixels G may be spaced apart from each other with a predetermined interval on a third row 3N, and a red sub-pixel R and a blue sub-pixel B may be alternately arranged on a fourth row 4N. Such pixel arrangement may be repeated up to a predetermined row set in advance.

The green sub-pixels G arranged on the first row 1N may be alternately arranged with the red sub-pixels R and the blue sub-pixels B on the second row 2N. Therefore, the red sub-pixel R and the blue sub-pixel B may be alternately arranged in a second direction (e.g. the y-direction) on a first column 1M, and the green sub-pixels G may be spaced apart from each other in the second direction with a predetermined interval on a second column 2M. Such pixel arrangement may be repeated up to a predetermined column set in advance. In this case, areas of the blue sub-pixel B and the red sub-pixel R may be greater than that of the green sub-pixel G. Alternatively, an area of the blue sub-pixel B may be greater than those of the red sub-pixel R and the green sub-pixel G.

Such pixel arrangement structure may be expressed in other words, in which: green sub-pixels G are arranged at first and third vertexes facing each other among vertexes of a virtual quadrangle VS; and a blue sub-pixel B and a red sub-pixel R are arranged at second and fourth vertexes, which are the rest of the vertexes. For example, green sub-pixels G may be arranged at the vertexes of the virtual quadrangle VS to face each other around a center VSE of the virtual quadrangle VS. Also, a blue sub-pixel B and a red sub-pixel R may be arranged at the vertexes of the virtual quadrangle VS to face each other around the center VSE of the virtual quadrangle VS. In this case, the virtual quadrangle VS may be a rectangle, a rhombus, or a square. The virtual quadrangle may be variously modified.

Extension lines of edges of the virtual quadrangle may be arranged in directions different from the first direction (e.g. the x-direction) or the second direction (e.g. the y-direction). Therefore, the virtual quadrangle VS may be tilted with respect to the first direction and the second direction.

Sub-pixels that emit light having different colors may be arranged at the vertexes of the virtual quadrangle VS. The sub-pixels may constitute one pixel area PD. Such sub-pixel arrangement structure is referred to as a pentile matrix which may implement a high resolution with a small number of sub-pixels by applying rendering driving which expresses color by sharing sub-pixels that neighbor each other.

However, a sub-pixel arrangement structure according to an embodiment is not limited to the pentile matrix structure. For example, the present disclosure is applicable to a sub-pixel arrangement structure having a strip arrangement, a mosaic arrangement, or a delta arrangement. Also, the present disclosure is applicable to a sub-pixel arrangement structure further including a white sub-pixel that emits white light.

In the present embodiment, sub-pixels may be classified into first to third sub-pixels. In an embodiment, the first to third sub-pixels may respectively correspond to a red sub-pixel R, a blue sub-pixel B, and a green sub-pixel G.

Figure 5A:
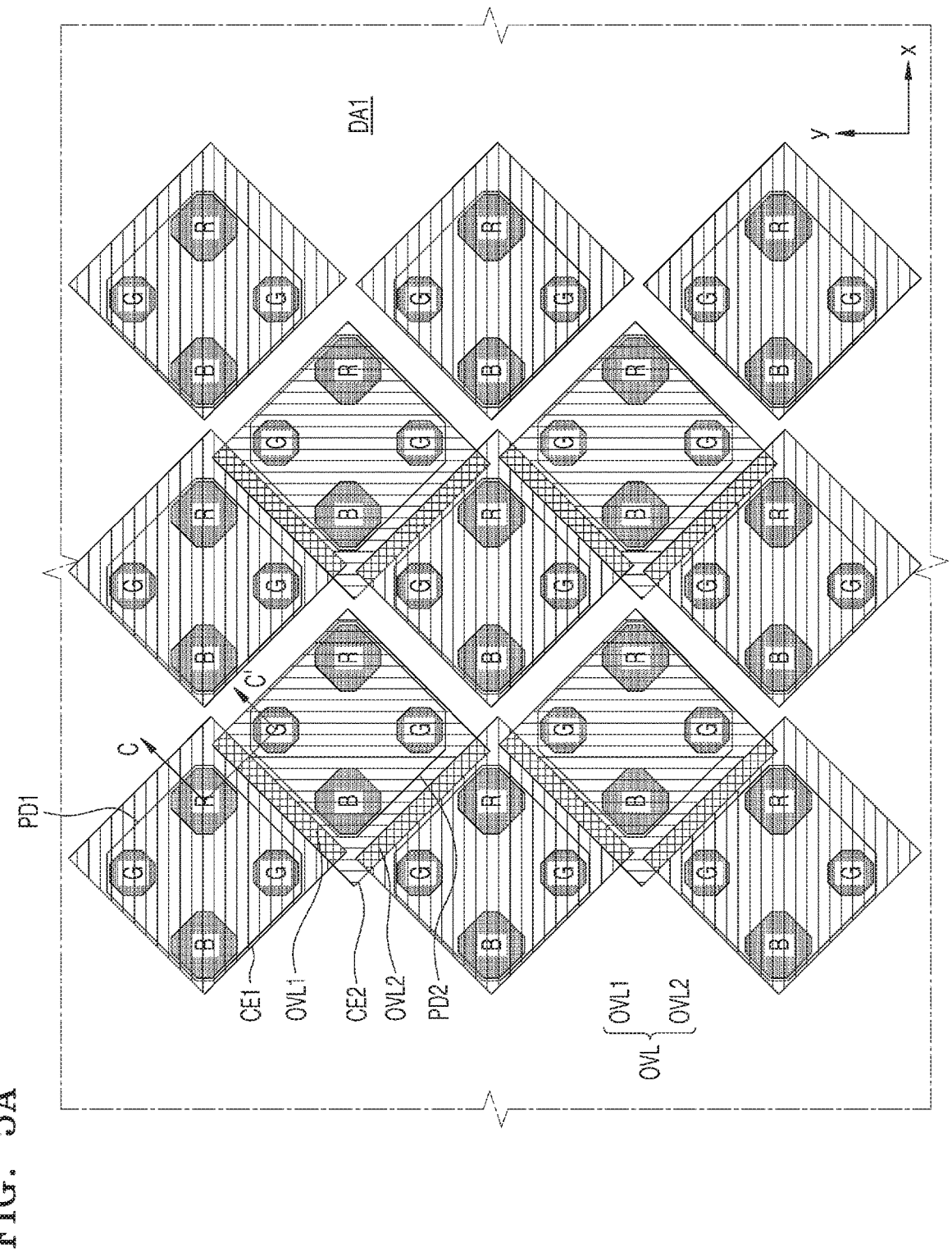
FIG. 5A is a plan view of a first display area of a display device according to an embodiment.

FIG. 5A is a plan view of the first display area DA of the display device 1 according to an embodiment.

FIG. 5a is a plan view of the first display area DA1 of the display device 1 according to an embodiment.

The first pixel areas PD1 may be spaced apart from each other. The second pixel area PD2 may neighbor the first pixel area PD1 and be apart from another second pixel area PD2. The first pixel area PD1 and the second pixel area PD2 each may include a plurality of sub-pixels, and the plurality of sub-pixels may be arranged in a pentile matrix structure.

First opposite electrodes CE1 may be arranged to correspond to the first pixel area PD1 and be apart from each other. The first opposite electrodes CE1 may be arranged larger than an area of the first pixel area PD1. Particularly, the first opposite electrodes CE1 in the first display area DA1 may be spaced apart from each other with a constant interval.

Second opposite electrodes CE2 may be arranged to correspond to the second pixel area PD2 and be apart from each other. The second opposite electrodes CE2 may be arranged larger than an area of the second pixel area PD2. Particularly, the second opposite electrodes CE2 in the first display area DA1 may be spaced apart from each other with a constant interval.

The first opposite electrode CE1 and the second opposite electrode CE2 may overlap each other to constitute an overlapping portion OVL. The first overlapping portion OVL may include a first overlapping portion OVL1 and a second overlapping portion OVL2. Though not shown in the drawing, the first overlapping portion OVL1 may contact the second overlapping portion OVL2. The first pixel area PD1 and the second pixel area PD2 may be surrounded by the overlapping portion OVL in the first display area DA1. Also, the overlapping portion OVL may be arranged in the first direction (e.g. the x-direction) or the second direction (e.g. the y-direction) with a constant interval.

However, the embodiment is not limited thereto. The opposite electrode in the first display area DA1 may be formed as one body. For example, the first pixel area PD1 and the second pixel area PD2 may overlap one opposite electrode.

Figure 5B:
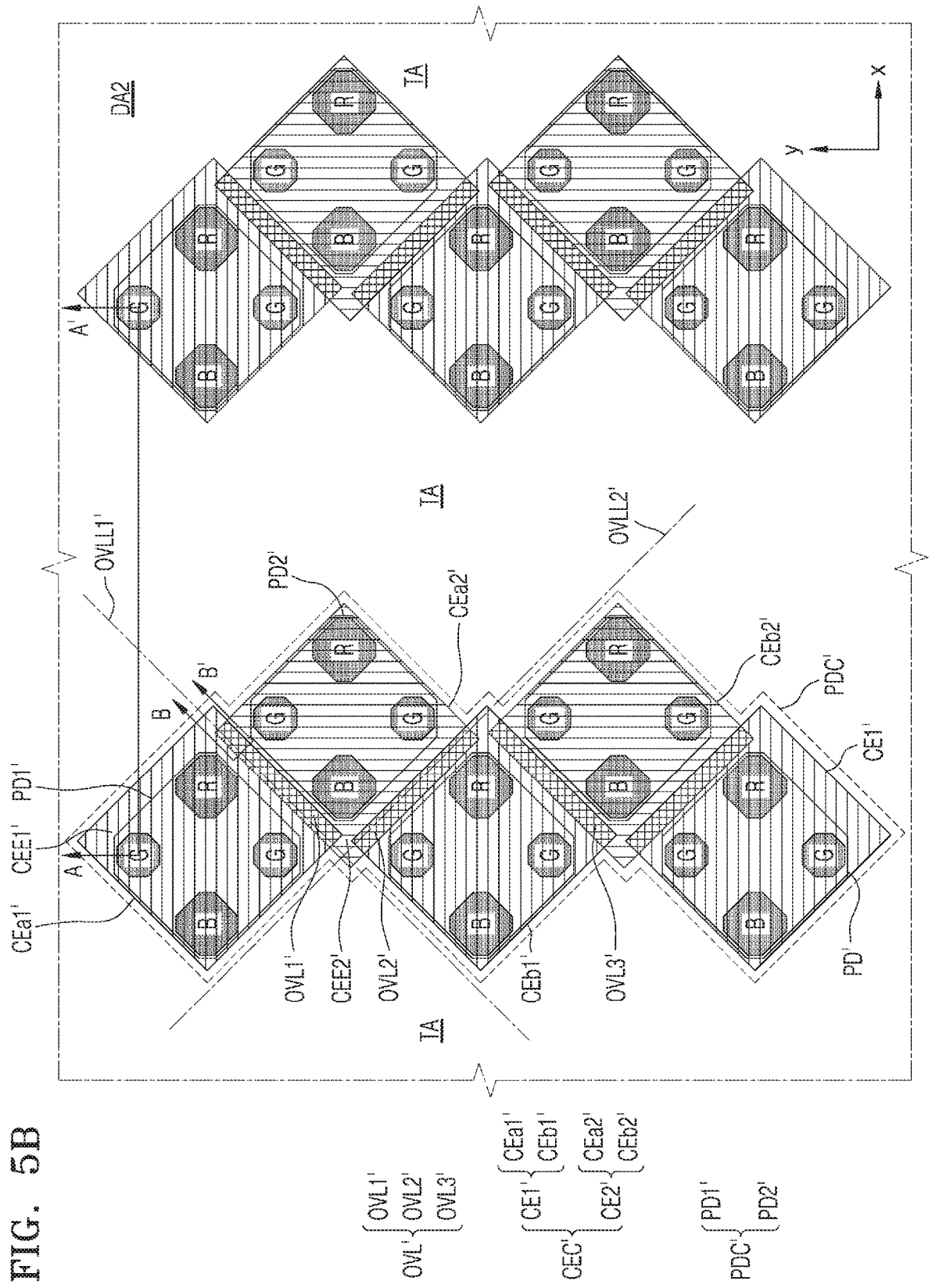
FIG. 5B is a plan view of a second display area of a display device according to an embodiment.

FIG. 5B is a plan view of the second display area DA2 of the display device 1 according to an embodiment.

Referring to FIG. 5B, a connection pixel area PDC' and transmissive areas TA are arranged in the second display area DA2 of the display device 1 according to an embodiment. One connection pixel area PDC' may be formed while predetermined pixel areas PD' are successively arranged.

It is shown that one connection pixel area PDC' is arranged in the second direction (e.g. the y-direction). However, the embodiment is not limited thereto. In another embodiment, the connection pixel area PDC' may be arranged in the first direction (e.g. the x-direction). In another embodiment, the connection pixel area PDC' may be arranged in a direction different from the first direction and the second direction.

The connection pixel area PDC' may include a first pixel area PD1' and a second pixel area PD2'. First pixel areas PD1' may be spaced apart from each other. A second pixel area PD2' may neighbor a first pixel area PD1' and be apart from another second pixel area PD2'. The first pixel area PD1' and the second pixel area PD2' each may include a plurality of sub-pixels, and the plurality of sub-pixels may be arranged in a pentile matrix structure.

In an embodiment, the first pixel area PD1' and the second pixel area PD2' may be arranged in zigzags. In another embodiment, the first pixel area PD1' and the second pixel area PD2' may be arranged on a straight line.

Connection opposite electrodes CEC' may be arranged to correspond to the connection pixel areas PDC'. The connection opposite electrodes CEC' may include first opposite electrodes CE1' apart from each other and overlapping portions OVL' that overlap the first opposite electrodes CE1', and include second opposite electrodes CE2' apart from each other.

The first opposite electrodes CE1' may be arranged to correspond to the first pixel area PD1' of the connection pixel area PDC'. The first opposite electrodes CE1' may include the first pixel area PD1' and have a rectangular shape as shown in FIG. 5B. However, the embodiment is not limited thereto and the shape of the first opposite electrodes CE1' may be variously modified such as a quadrangle and a rhombus.

The first opposite electrodes CE1' may be arranged larger than a range of the first pixel area PD1', and may include a first additional area CEE1' that does not overlap the first pixel area PD1'. For example, in the case where a planar shape of the first pixel area PD1' is a square, the first opposite electrodes CE1' may include the first additional area CEE1' that does not overlap the first pixel area PD1' and thus may be a rectangle in a plan view. The first additional area CEE1' may overlap a portion of the second opposite electrodes CE2' and include the overlapping portion OVL'.

The first opposite electrodes CE1' may be spaced apart from each other. For example, the first opposite electrodes CE1' may be spaced apart from each other in the first direction and the second direction. However, the embodiment is not limited thereto and the first opposite electrodes CE1' may be spaced apart from each other in a direction different from the first direction and the second direction.

The first opposite electrodes CE1' may be spaced apart from each other with the transmissive area TA therebetween in the second display area DA2 including the transmissive area TA. Therefore, a separation distance between the first opposite electrodes CE1' that are spaced apart from each other with the transmissive area TA therebetween may be different from a separation distance between the first opposite electrodes CE1' that are not spaced apart from each other with the transmissive area TA therebetween. Also, a separation distance between the first opposite electrodes CE1' that neighbor each other in the second display area DA2 may be different from a separation distance between the first opposite electrodes CE1 that neighbor each other in the first display area DA1. For example, a separation distance between the first opposite electrodes CE1' that neighbor each other across the transmissive area TA in the second display area DA2 may be greater than a separation distance between the first opposite electrodes CE1 that neighbor each other in the first display area DA1.

The second opposite electrodes CE2' may be arranged to correspond to the second pixel area PD2' of the connection pixel area PDC'. As shown in FIG. 5B, the second opposite electrodes CE2' may have a rectangular shape. However, the embodiment is not limited thereto and the shape of the second opposite electrodes CE2' may be variously modified such as a quadrangle and a rhombus.

The second opposite electrodes CE2' may be arranged larger than a range of the second pixel area PD2', and may include a second additional area CEE2' that does not overlap the second pixel area PD2'. For example, in the case where a planar shape of the second pixel area PD2' is a square, the second opposite electrodes CE2' may include the second additional area CEE2' that does not overlap the second pixel area PD2' and thus may be a rectangle in a plan view. The second additional area CEE2' may overlap a portion of the first additional area CEE1' and include the overlapping portion OVL'.

The second opposite electrodes CE2' may be spaced apart from each other. For example, the second opposite electrodes CE2' may be spaced apart from each other in the first direction and the second direction. However, the embodiment is not limited thereto and the second opposite electrodes CE2' may be spaced apart from each other in a direction different from the first direction and the second direction.

The second opposite electrodes CE2' may be spaced apart from each other with the transmissive area TA therebetween. Therefore, a separation distance between the second opposite electrodes CE2' that are apart from each other with the transmissive area TA therebetween may be different from a separation distance between the second opposite electrodes CE2' that are not apart from each other with the transmissive area TA therebetween. Also, a separation distance between the second opposite electrodes CE2' that neighbor each other in the second display area DA2 may be different from a separation distance between the second opposite electrodes CE2' that neighbor each other in the first display area DA1. For example, a separation distance between the second opposite electrodes CE2' that neighbor each other across the transmissive area TA in the second display area DA2 may be greater than a separation distance between the second opposite electrodes CE2 that neighbor each other in the first display area DA1.

The overlapping portion OVL' may include a first overlapping portion OVL1', a second overlapping portion OVL2', and a third overlapping portion OVL3'. As described above, the overlapping portion OVL' may be formed while the first opposite electrode CE1' overlaps the second opposite electrode CE2'. The overlapping portion OVL' may be formed while the first opposite electrode CE1' overlaps the second opposite electrode CE2' in planar forms and may have a rectangular shape in a plan view. However, the overlapping portion OVL' is not limited thereto and may have various shapes. Particularly, the overlapping portion OVL' may be formed while the first additional area CEE1' overlaps the second additional area CEE2'. As described below, a thickness of the overlapping portion OVL' may be greater than thicknesses of the first opposite electrodes CE1' and the second opposite electrodes CE2'. The first opposite electrodes CE1' may be electrically connected to the second opposite electrodes CE2' by the overlapping portion OVL'. The overlapping portion OVL' may be arranged so as to prevent an electrode disconnection phenomenon of the opposite electrode.

The first overlapping portion OVL1' may be formed while a first central opposite electrode CEa1', which is one of the first opposite electrodes CE1' overlaps a second central opposite electrode CEa2', which is one of the second opposite electrodes CE2'. The second overlapping portion OVL2' may be formed while the second central opposite electrode CEa2' overlaps a first peripheral opposite electrode CEb1', which is another of the first opposite electrodes CE1'. The third overlapping portion OVL3' may be formed while the first peripheral opposite electrode CEb1' overlaps a second peripheral opposite electrode CEb2', which is another of the second opposite electrodes CE2'.

Since one of the first opposite electrodes CE1' is selected and another of the first opposite electrodes CE1' is selected again, the third overlapping portion OVL3' and the first overlapping portion OVL1' may denote the same overlapping portion. Therefore, the first overlapping portion OVL1' and the second overlapping portion OVL2' are mainly described.

A first extension line OVLL1' of the first overlapping portion OVL1' in a lengthwise direction may intersect with a second extension line OVLL2' of the second overlapping portion OVL2' in a lengthwise direction. Particularly, the first extension line OVLL1' may be perpendicular to the second extension line OVLL2'. However, the embodiment is not limited thereto and the first extension line OVLL1' may intersect with the second extension line OVLL2' at various angles. Therefore, the first opposite electrodes CE1' and the second opposite electrodes CE2' may overlap each other in zigzags and be connected to each other.

Though not shown in the drawings, the first overlapping portion OVL1' may contact the second overlapping portion OVL2'. For example, one side of the first overlapping portion OVL1' may contact at least a portion of one side of the second overlapping portion OVL2'.

The transmissive area TA is a region in which a display element is not arranged and thus a light transmittance is high. The transmissive area TA may be provided as a plurality of transmissive areas TA in the second display area DA2. For example, the transmissive area TA may not overlap the connection opposite electrodes CEC' and the pixel electrode described below. For another example, the pixel electrode, an emission layer, or a second common layer described below may be arranged in the transmissive area TA.

In an embodiment, the transmissive areas TA may be alternately arranged in the first direction and/or the second direction with the connection opposite electrodes CEC'. In another embodiment, the transmissive area TA may surround the connection opposite electrodes CEC'. In another embodiment, the connection opposite electrodes CEC' may surround the transmissive area TA.

Though not shown in the drawing, a connection pixel area PDC' may overlap a wiring (not shown), and the transmissive area TA may not overlap a wiring. For example, the wiring may include the data line DL, the scan line SL, and the second power supply line 170 of FIG. 3. In an embodiment, a wiring that may influence a light transmittance may be arranged in the second direction along the connection pixel area PDC'. In another embodiment, the wiring may be arranged in zigzags along the connection pixel area PDC'.

Since the connection opposite electrodes CEC' and the transmissive areas TA are alternately arranged, a light transmittance of the second display area DA2 may be increased. The first overlapping portion OVL1' and the second overlapping portion OVL2' included in the connection opposite electrodes CEC' are intended for preventing an electrode disconnection phenomenon of the first opposite electrodes CE1' and the second opposite electrodes CE2'.

Hereinafter, a structure in which elements included in the display device 1 are stacked according to an embodiment is described in detail with reference to FIG. 6A.

Figure 6A:
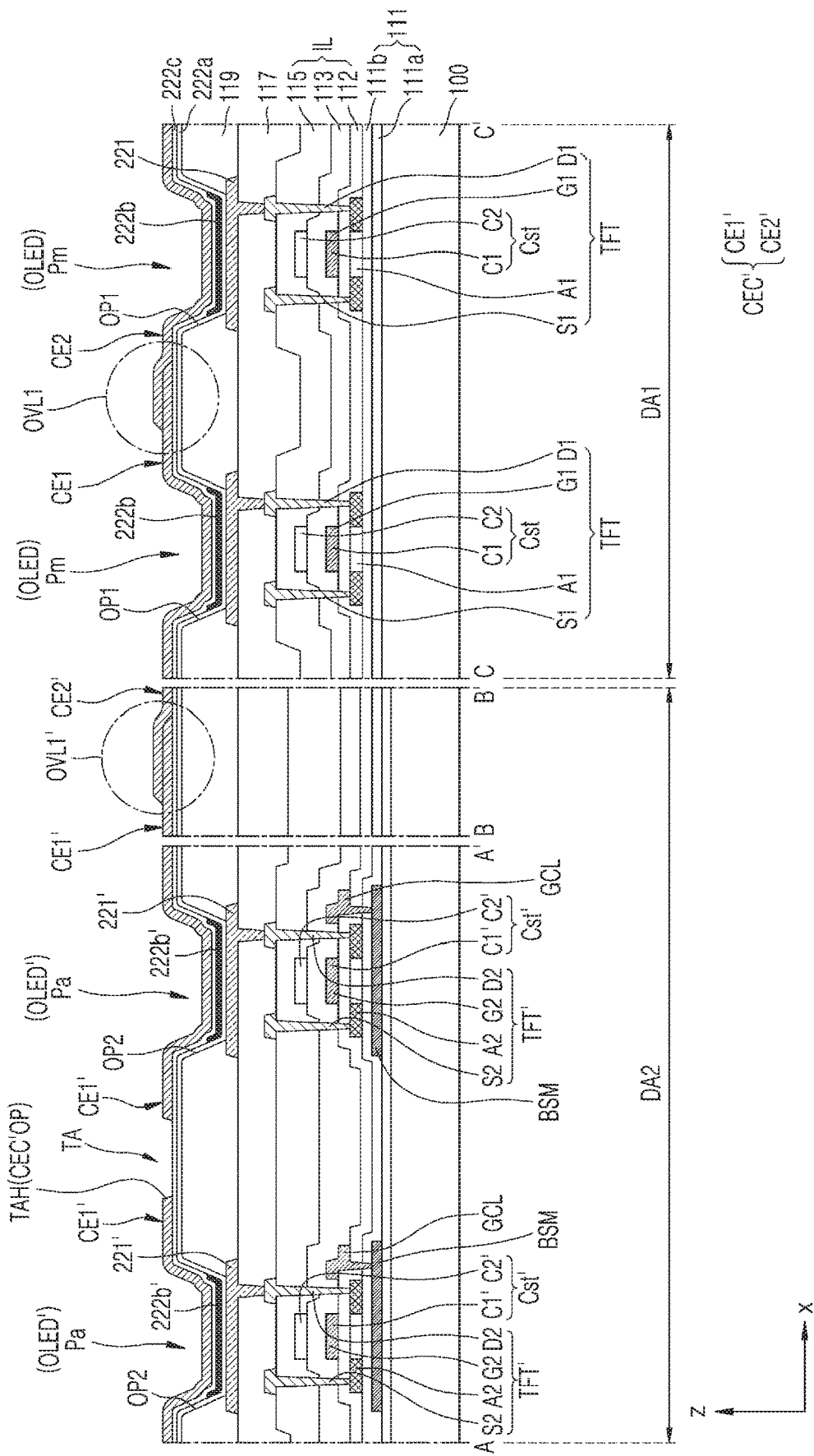
FIG. 6A is a cross-sectional view taken along line C-C' of FIG. 5A, and lines A-A' and B-B' of FIG. 5B.

FIG. 6A is a cross-sectional view taken along line C-C' of FIG. 5A, and lines A-A' and B-B' of FIG. 5B.

Referring to FIG. 6A, the display device 1 according to an embodiment includes the first display area DA1 and the second display area DA2. A main pixel Pm is arranged in the first display area DA1, and an auxiliary pixel Pa and a transmissive area TA are arranged in the second display area DA2.

The main pixel Pm may include a main thin film transistor TFT, a main storage capacitor Cst, and a main organic light-emitting diode OLED. The auxiliary pixel Pa may include an auxiliary thin film transistor TFT', an auxiliary storage capacitor Cst', and an auxiliary organic light-emitting diode OLED'. The transmissive area TA may include a transmissive hole TAH corresponding to the transmissive area TA.

The substrate 100 may include glass or a polymer resin. The polymer resin may include polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 100 including the polymer resin may be flexible, rollable, or bendable. The substrate 100 may have a multi-layered structure including a layer including a polymer resin, and an inorganic layer (not shown).

A buffer layer 111 may be located on the substrate 100, may reduce or prevent the penetration of foreign substances, moisture, or external air from below the substrate 100, and may provide a flat surface on the substrate 100. The buffer layer 111 may include an inorganic material such as an oxide or a nitride, or an organic material, or an organic/inorganic composite material and include a single-layered or multi-layered structure of an inorganic material and/or an organic material. A barrier layer (not shown) may be further provided between the substrate 100 and the buffer layer 111, the barrier layer blocking the penetration of external air. In an embodiment, the buffer layer 111 may include silicon oxide ($SiO_2$) or silicon nitride ($SiN_x$). The buffer layer 111 may include a first buffer layer 111a and a second buffer layer 111b that are stacked.

In the second display area DA2, a bottom electrode layer BSM may be arranged between the first buffer layer 111a and the second buffer layer 111b. In another embodiment, the bottom electrode layer BSM may be arranged between the substrate 100 and the first buffer layer 111a. The bottom electrode layer BSM may be arranged below the auxiliary thin film transistor TFT' to prevent a characteristic of the auxiliary thin film transistor TFT' from being deteriorated by light emitted from the component 20, and the like.

Also, the bottom electrode layer BSM may be connected to a wiring GCL arranged on a different layer through a contact hole. The bottom electrode layer BSM may receive a constant voltage or a signal from the wiring GCL. For example, the bottom electrode layer BSM may receive a driving voltage ELVDD or a scan signal. Since the bottom electrode layer BSM may receive a constant voltage or a scan signal, a probability that electrostatic discharge occurs may be remarkably reduced. The bottom electrode layer BSM may include Al, Pt, Pd, Ag, Mg, Au, Ni, Nd, Ir, Cr, Li, Ca, Mo, Ti, W, and/or Cu. The bottom electrode layer BSM may include a single layer or a multi-layer including at least one of the above materials.

The main thin film transistor TFT and the auxiliary thin film transistor TFT' may be arranged on the buffer layer 111. The main thin film transistor TFT includes a first semiconductor layer A1, a first gate electrode G1, a first source electrode S1, and a first drain electrode D1. The auxiliary thin film transistor TFT' includes a second semiconductor layer A2, a second gate electrode G2, a second source electrode S2, and a second drain electrode D2. The main thin film transistor TFT may be connected to the main organic light-emitting diode OLED in the first display area DA1 to drive the main organic light-emitting diode OLED. The auxiliary thin film transistor TFT' may be connected to the auxiliary organic light-emitting diode OLED' in the second display area DA2 to drive the auxiliary organic light-emitting diode OLED'.

The first semiconductor layer A1 and the second semiconductor layer A2 may be arranged on the buffer layer 111 and may include polycrystalline silicon. In another embodiment, the first semiconductor layer A1 and the second semiconductor layer A2 may include amorphous silicon. In another embodiment, the first semiconductor layer A1 and the second semiconductor layer A2 may include an oxide of at least one of In, Ga, Sn, Zr, V, Hf, Cd, Ge, Cr, Ti, and Zn. The first semiconductor layer A1 and the second semiconductor layer A2 each may include a channel region, a source region, and a drain region, the source region and the drain region being doped with impurities.

The second semiconductor layer A2 may overlap the bottom electrode layer BSM with the second buffer layer 111b therebetween. In an embodiment, a width of the second semiconductor layer A2 may be less than a width of the bottom electrode BSM. Therefore, when projected in a direction perpendicular to the substrate 100, the second semiconductor layer A2 may entirely overlap the bottom electrode layer BSM.

A first gate insulating layer 112 may cover the first semiconductor layer A1 and the second semiconductor layer A2. The first gate insulating layer 112 may include an inorganic insulating material such as $SiO_2$, $SiN_x$, SiON, $Al_2O_3$, $TiO_2$, $Ta_2O_5$, $HfO_2$, or $ZnO_2$. The first gate insulating layer 112 may include a single layer or a multi-layer including the at least one of the above inorganic insulating materials.

A first gate electrode G1 and a second gate electrode G2 are arranged on the first gate insulating layer 112, the first gate electrode G1 and the second gate electrode G2 respectively overlapping the first semiconductor layer A1 and the second semiconductor layer A2. The first gate electrode G1 and the second gate electrode G2 may include a single layer and a multi-layer including at least one of Mo, Al, Cu, and Ti. For example, the first gate electrode G1 and the second gate electrode G2 each may include a single Mo layer.

A second gate insulating layer 113 may cover the first gate electrode G1 and the second gate electrode G2. The second gate insulating layer 113 may include an inorganic insulating material such as $SiO_2$, $SiN_x$, SiON, $Al_2O_3$, $TiO_2$, $Ta_2O_5$, $HfO_2$, or $ZnO_2$. The second gate insulating layer 113 may include a single layer or a multi-layer including at least one of the above inorganic insulating materials.

A first top electrode C2 of the main storage capacitor Cst and a second top electrode C2' of the auxiliary storage capacitor Cst' may be arranged on the second gate insulating layer 113.

In the first display area DA1, the first top electrode C2 may overlap the gate electrode G1 therebelow. The first gate electrode G1 and the first top electrode C2 may constitute the main storage capacitor Cst, the first gate electrode G1 and the first top electrode C2 overlapping each other with the second gate insulating layer 113 therebetween. That is, the first gate electrode G1 may serve as a first bottom electrode C1 of the main storage capacitor Cst.

In the second display area DA2, the second top electrode C2' may overlap the second gate electrode G2 therebelow. The second gate electrode G2 and the second top electrode C2' may constitute the auxiliary storage capacitor Cst', the second gate electrode G2 and the second top electrode C2' overlapping each other with the second gate insulating layer 113 therebetween. The second gate electrode G2 may serve as a second bottom electrode C1' of the auxiliary storage capacitor Cst'.

The first top electrode C2 and the second top electrode C2' each may include Al, Pt, Pd, Ag, Mg, Au, Ni, Nd, Ir, Cr, Li, Ca, Mo, Ti, W, and/or Cu, and may include a single layer or a multi-layer including at least one of the above materials.

An interlayer insulating layer 115 may cover the first top electrode C2 and the second top electrode C2'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The first and second source electrodes S1 and S2 and the first and second drain electrodes D1 and D2 may be arranged on the interlayer insulating layer 115. The first and second source electrodes S1 and S2 and the first and second drain electrodes D1 and D2 may include a conductive material including Mo, Al, Cu, and Ti and include a single layer or a multi-layer including the above materials. For example, the first and second source electrodes S1 and S2 and the first and second drain electrodes D1 and D2 may have a multi-layered structure of Ti/Al/Ti.

A planarization layer 117 may cover the first and second source electrodes S1 and S2 and the first and second drain electrodes D1 and D2. The planarization layer 117 may have a flat top surface such that a first pixel electrode 221 and a second pixel electrode 221' arranged thereon may be formed flat.

The planarization layer 117 may include a single layer or a multi-layer including an organic material or an inorganic material. The planarization layer 117 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. Also, the planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the planarization layer 117 is formed, chemical mechanical polishing may be performed so as to provide a flat top surface to the planarization layer 117.

There is an opening in the planarization layer 117, the opening exposing one of the first source electrode S1 and the first drain electrode D1 of the main thin film transistor TFT. The first pixel electrode 221 may be electrically connected to the main thin film transistor TFT by contacting the first source electrode S1 or the first drain electrode D1 through the opening in the planarization layer 117.

Also, the planarization layer 117 includes an opening exposing one of the second source electrode S2 and the second drain electrode D2 of the auxiliary thin film transistor TFT'. The second pixel electrode 221' may be electrically connected to the auxiliary thin film transistor TFT' by contacting the second source electrode S2 or the second drain electrode D2 through the opening.

The first pixel electrode 221 and the second pixel electrode 221' may include a conductive oxide such as indium tin oxide (ITO), zinc oxide (IZO), zinc oxide (ZnO), indium oxide ($In_2O_3$), indium gallium oxide (IGO), or aluminum zinc oxide (AZO). In another embodiment, the first pixel electrode 221 and the second pixel electrode 221' each may include a reflective layer including Ag, Mg, Al, Pt, Pd, Au, Ni, Nd, Ir, Cr, or a compound thereof. In another embodiment, the first pixel electrode 221 and the second pixel electrode 221' may further include a layer including ITO, IZO, ZnO, or $In_2O_3$ on/under the reflective layer. In another embodiment, the first pixel electrode 221 and the second pixel electrode 221' may have a stacked structure of ITO/Ag/ITO.

A pixel-defining layer 119 may cover edges of each of the first pixel electrode 221 and the second pixel electrode 221'. The pixel-defining layer 119 includes a first opening OP1 and a second opening OP2, the first opening OP1 and the second opening OP2 respectively overlapping the first pixel electrode 221 and the second pixel electrode 221' and defining an emission area of a pixel. The pixel-defining layer 119 may prevent an arc, etc. from occurring at edges of the pixel electrodes, that is, the first and second pixel electrodes 221 and 221' by increasing a distance between the edges of the first and second pixel electrodes 221 and 221' and the opposite electrode 223 over the first and second pixel electrodes 221 and 221'. The pixel-defining layer 119 may include an organic insulating material such as polyimide, polyamide, an acrylic resin, BCB, HMDSO, and a phenolic resin. The pixel-defining layer 119 may be formed by a method such as spin coating.

A first functional layer 222a may be arranged on the first and second pixel electrodes 221 and 221' exposed through the first opening OP1 and the second opening OP2 of the pixel-defining layer 119. The first functional layer 222a may extend to a top surface of the pixel-defining layer 119. The first functional layer 222a may include a single layer or a multi-layer. The first functional layer 222a may include a hole transport layer (HTL) which has a single-layered structure. Alternatively, the first functional layer 222a may include a hole injection layer (HIL) and a hole transport layer (HTL). The first functional layer 222a may be provided as one body so as to correspond to main pixels Pm and auxiliary pixels Pa included in the first display area DA1 and the second display area DA2.

A first emission layer 222b and a second emission layer 222b' are arranged on the first functional layer 222a, the first emission layer 222b and the second emission layer 222b' respectively corresponding to the first pixel electrode 221 and the second pixel electrode 221'. The first emission layer 222b and the second emission layer 222b' each may include a polymer material or a low molecular weight material, and emit red, green, blue, or white light.

A second functional layer 222c may be formed on the first emission layer 222b and the second emission layer 222b'. The second functional layer 222c may include a single layer or a multi-layer. The second functional layer 222c may include an electron transport layer (ETL) and/or an electron injection layer (EIL). The second functional layer 222c may be provided as one body so as to correspond to main pixels Pm and auxiliary pixels Pa included in the first display area DA1 and the second display area DA2. The first functional layer 222a and/or the second functional layer 222c may be omitted.

The connection opposite electrode CEC' is arranged on the second functional layer 222c. The connection opposite electrode CEC' may include a conductive material having a small work function. For example, the connection opposite electrode CEC' may include a (semi) transparent layer including Ag, Mg, Al, Pt, Pd, Au, Ni, Nd, Ir, Cr, Li, Ca, or an alloy thereof. Alternatively, the connection opposite electrode CEC' may further include a layer including ITO, IZO, ZnO, or $In_2O_3$ on the (semi) transparent layer including the above material.

In the present embodiment, as described above, the connection opposite electrode CEC' includes the first opposite electrodes CE1' and the second opposite electrodes CE2'.

Figure 7:
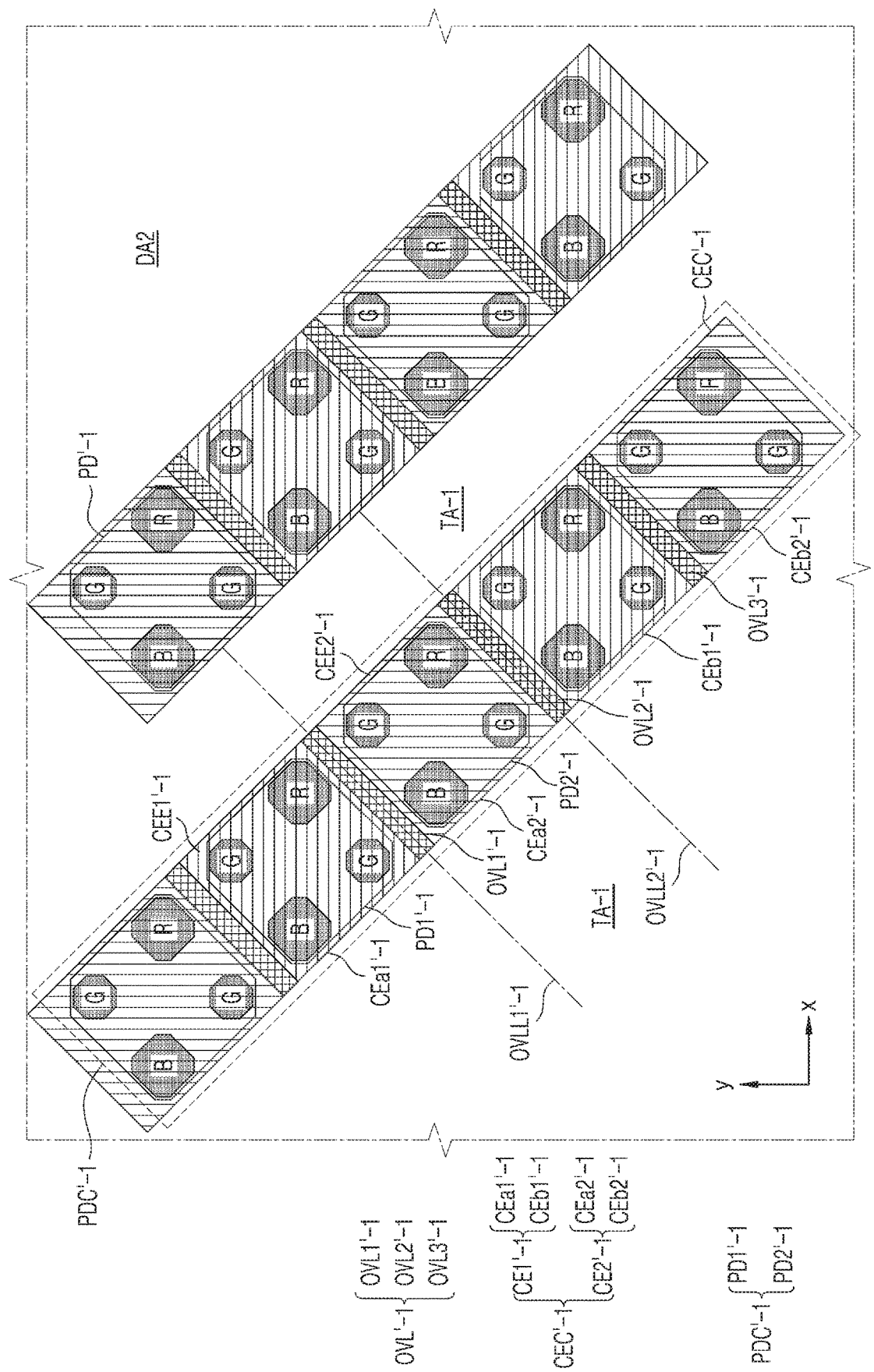
FIG. 7 is a plan view of a second display area of a display device according to another embodiment.

The first opposite electrodes CE1 and CE1' that neighbor each other among the first opposite electrodes CE1 and CE1', and the second opposite electrodes CE2 and CE2' may overlap and contact each other at edges thereof (overlapping portions OVL1 and OVL1' in FIG. 7). The overlapping portions OVL1 and OVL1' may be respectively formed between the main pixels Pm and the auxiliary pixels Pa. Thicknesses of the overlapping portions OVL1 and OVL1' may be greater than thicknesses of the first opposite electrodes CE1 and CE1' or the second opposite electrodes CE2 and CE2' in their central region.

In the second display area DA2, some of the first opposite electrodes CE1' may be spaced apart from each other with the transmissive area TA therebetween. In this case, a separation space by the first opposite electrodes CE1' may be an opening CEC'OP of the connection opposite electrode CEC'. The opening CEC'OP may serve as the transmissive hole TAH through which light passes.

Since the forming of the transmissive hole TAH means that a member such as the connection opposite electrode CEC', etc. corresponding to the transmissive area TA are removed, a light transmittance of the transmissive area TA may be remarkably increased.

Though not shown in the drawing, a capping layer may be formed on the connection opposite electrode CEC', the capping layer improving a light extracting efficiency while protecting the connection opposite electrode CEC'. The capping layer may include LiF. Alternatively, the capping layer may include an inorganic insulating material such as silicon nitride and/or an organic insulating material. In an embodiment, the capping layer may be omitted.

Figure 6C:
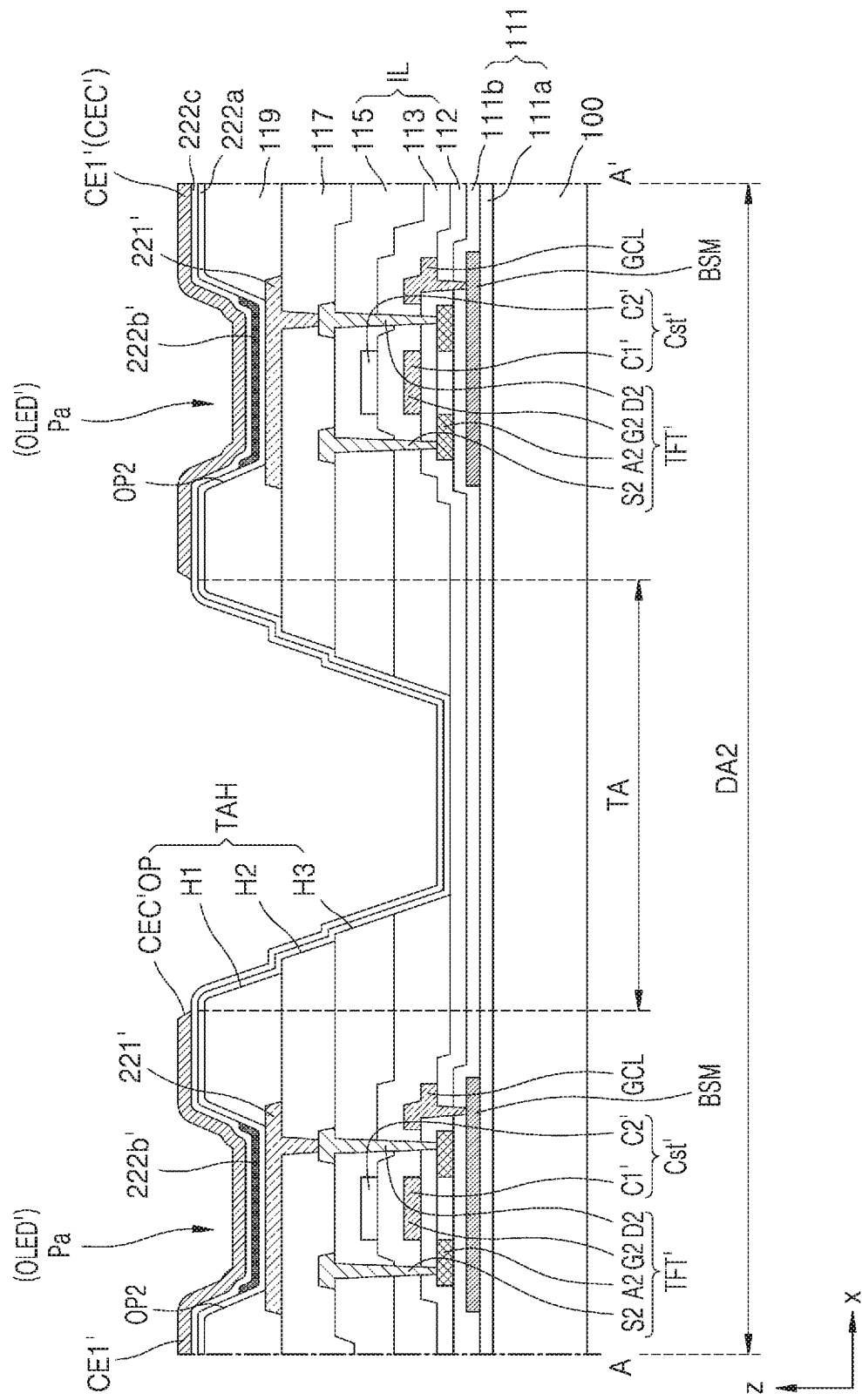
FIG. 6C is a cross-sectional view of a display device according to another embodiment.

FIG. 6B is a cross-sectional view of the display device 1 according to another embodiment. FIG. 6C is a cross-sectional view of the display device 1 according to another embodiment. FIGS. 6B and 6C may correspond to cross-sections taken along line A-A' of FIG. 5. Since the same reference numerals as those of FIG. 6A denote the same members in FIGS. 6B and 6C, repeated description thereof is omitted.

Though it is shown in FIG. 6A that the transmissive hole TAH is formed as the opening CEC'OP of the connection opposite electrode CEC', the embodiment is not limited thereto.

Referring to FIG. 6B, the transmissive hole TAH may further include a first hole H1 and/or a second hole H2, the first hole H1 being defined in the pixel-defining layer 119, and the second hole H2 being defined in the planarization layer 117.

The pixel-defining layer 119 may include the first hole H1 corresponding to the transmissive area TA. The first hole H1 may overlap the opening CEC'OP of the connection opposite electrode CEC'. Though it is shown in the drawing that a bottom width of the opening CEC'OP is greater than a bottom width of the first hole H1, the embodiment is not limited thereto. For example, the connection opposite electrode CEC' may extend to an inner wall of the transmissive hole TAH and thus a width of the opening CEC'OP may be less than a width of the first hole H1.

The planarization layer 117 may include the second hole H2 corresponding to the transmissive area TA. The second hole H2 may overlap the opening CEC'OP of the connection opposite electrode CEC'. Though it is shown in the drawing that the bottom width of the first hole H1 is greater than a width of the second hole H2, the embodiment is not limited thereto. For example, since the pixel-defining layer 119 may cover edges of the second hole H2 of the planarization layer 117, a width of the first hole H1 may be less than a width of the second hole H2.

Since the first hole H1 and/or the second hole H2 are formed, a light transmittance of the transmissive area TA may be improved even more. Though it is shown in the drawing that both the first hole H1 and the second hole H2 are formed, the embodiment is not limited thereto. For example, only one of the first hole H1 and the second hole H2 corresponding to the transmissive area TA may be provided. Various modifications may be made. The first functional layer 222a and the second functional layer 222c may be arranged inside the transmissive hole TAH.

Referring to FIG. 6C, the transmissive hole TAH may further include a third hole H3 corresponding to the transmissive area TA.

Assuming that the first gate insulating layer 112, the second gate insulating layer 113, and the interlayer insulating layer 115 are collectively referred to as an inorganic insulating layer IL, the inorganic insulating layer IL may include the third hole H3 corresponding to the transmissive area TA. The third hole H3 may expose a top surface of the buffer layer 111 or the substrate 100. The third hole H3 may be formed while a first opening of the first gate insulating layer 112, a second opening of the second gate insulating layer 113, and a third opening of the interlayer insulating layer 115 overlap one another. The first to third openings may be respectively formed through separate processes, or simultaneously formed through the same process. Alternatively, the first opening and the second opening may be simultaneously formed, and the third opening may be separately formed. Various modifications may be made. In the case where the first opening and the third opening are formed through separate processes, a step difference may be formed on a lateral surface of the third hole H3.

The inorganic insulating layer IL may include a groove instead of the third hole H3 exposing the buffer layer 111. For example, the first gate insulating layer 112 of the inorganic insulating layer IL may be continuously arranged in the transmissive area TA, and the second gate insulating layer 113 and the interlayer insulating layer 115 may include the second opening and the third opening corresponding to the transmissive area TA.

Alternatively, the first gate insulating layer 112 and the second gate insulating layer 113 may be continuously arranged in the transmissive area TA, and the interlayer insulating layer 115 may include the third opening corresponding to the transmissive area TA. Various modifications may be made.

In the present embodiments, since the inorganic insulating layer IL, the planarization layer 117, and the pixel-defining layer 119 may have a light transmittance that allows transmission/reception of the component 20, the inorganic insulating layer IL, the planarization layer 117, and the pixel-defining layer 119 may not include a hole corresponding to the transmissive area TA. However, in the case where the inorganic insulating layer IL, the planarization layer 117, and the pixel-defining layer 119 include a hole corresponding to the transmissive area TA, a light transmittance may be improved even more.

FIG. 7 is a plan view of the second display area DA2 of the display device 1 according to another embodiment.

In FIG. 7, the same reference numerals as those of FIG. 5B denote the same members, and repeated description thereof is omitted for brief description.

Referring to FIG. 7, a connection pixel area PDC'-1 and transmissive areas TA-1 are arranged in the second display area DA2 of the display device 1. Predetermined pixel areas PD'-1 may be successively arranged to constitute one connection pixel area PDC'-1. As shown in FIG. 7, the connection pixel area PDC'-1 may be arranged in a direction different from the first direction (e.g. the x-direction) and the second direction (e.g. the y-direction).

The connection pixel area PDC'-1 may include a first pixel area PD1'-1 and a second pixel area PD2'-1. First pixel areas PD1'-1 may be spaced apart from each other. A second pixel area PD2'-1 may neighbor a first pixel area PD1'-1 and be apart from another second pixel area PD2'-1. The first pixel area PD1'-1 and the second pixel area PD2'-1 each may include a plurality of sub-pixels, and the plurality of sub-pixels may be arranged in a pentile matrix structure.

As shown in FIG. 7, the first pixel area PD1'-1 and the second pixel area PD2'-1 may be arranged on a straight line.

Connection opposite electrodes CEC'-1 may be arranged to correspond to the connection pixel area PDC'-1. The connection opposite electrodes CEC'-1 may include first opposite electrodes CE1'-1 and second opposite electrodes CE2'-1 apart from each other, and second opposite electrodes CE2'-1 include overlapping portions OVL'-1 that overlap the first opposite electrodes CE1'-1.

The first opposite electrodes CE1'-1 may be arranged to correspond to the first pixel area PD1'-1 of the connection pixel area PDC'-1. The first opposite electrodes CE1'-1 may be arranged larger than a range of the first pixel area PD1'-1, and may include a first additional area CEE1'-1 that does not overlap the first pixel area PD1'-1. The first opposite electrodes CE1'-1 may be spaced apart from each other with the transmissive area TA therebetween.

The second opposite electrodes CE2'-1 may be arranged to correspond to the second pixel area PD2'-1 of the connection pixel area PDC'-1. The second opposite electrodes CE2'-1 may be arranged larger than a range of the second pixel area PD2'-1, and may include a second additional area CEE2'-1 that does not overlap the second pixel area PD2'-1. The second additional area CEE2'-1 may overlap a portion of the first additional area CEE1'-1 and include an overlapping portion OVL'-1. The second opposite electrodes CE2'-1 may be spaced apart from each other with the transmissive area TA therebetween.

The overlapping portion OVL'-1 may include a first overlapping portion OVL1'-1, a second overlapping portion OVL2'-1, and a third overlapping portion OVL3'-1.

In an embodiment, the transmissive areas TA may be alternately arranged in the first direction and/or the second direction with the connection opposite electrodes CEC'-1. In another embodiment, the transmissive area TA may surround the connection opposite electrodes CEC'-1. In another embodiment, the connection opposite electrodes CEC'-1 may surround the transmissive area TA.

The first opposite electrodes CE1'-1 and the second opposite electrodes CE2'-1 may be arranged on a straight line. Also, a first extension line OVLL1'-1 of the first overlapping portion OVL1'-1 in a lengthwise direction may be parallel to a second extension line OVLL2'-1 of the second overlapping portion OVL2'-1 in a lengthwise direction. Since the first extension line OVLL1'-1 is parallel to the second extension line OVLL2'-1, the first opposite electrodes CE1'-1 may overlap the second opposite electrodes CE2'-1 on a straight line. Therefore, since an opposite electrode disconnection phenomenon is prevented, the reliability of the display device 1 may be improved.

Figure 8A:
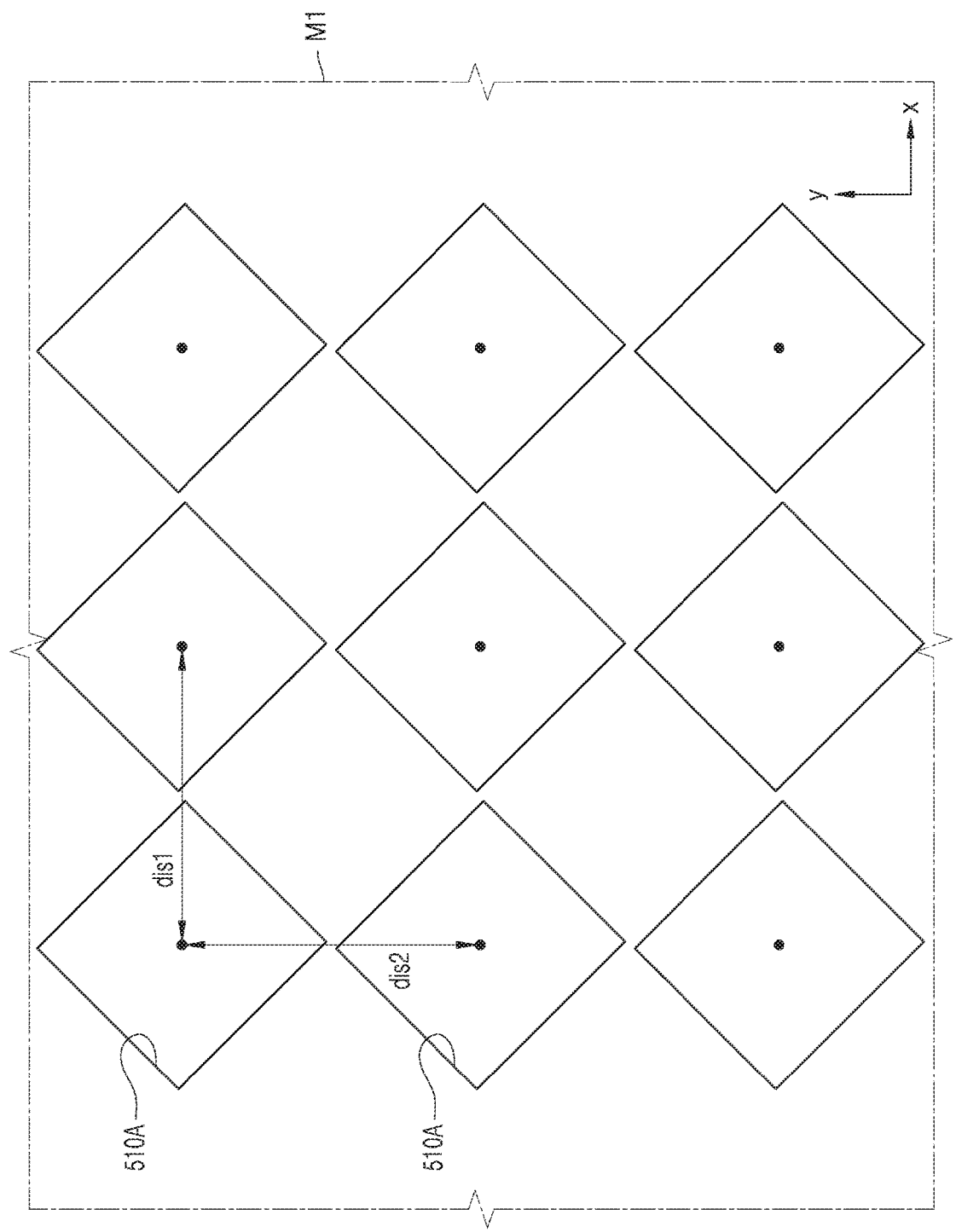
FIG. 8A is a plan view of an example of a first mask for forming an opposite electrode in a first display area according to an embodiment.
Figure 9A:
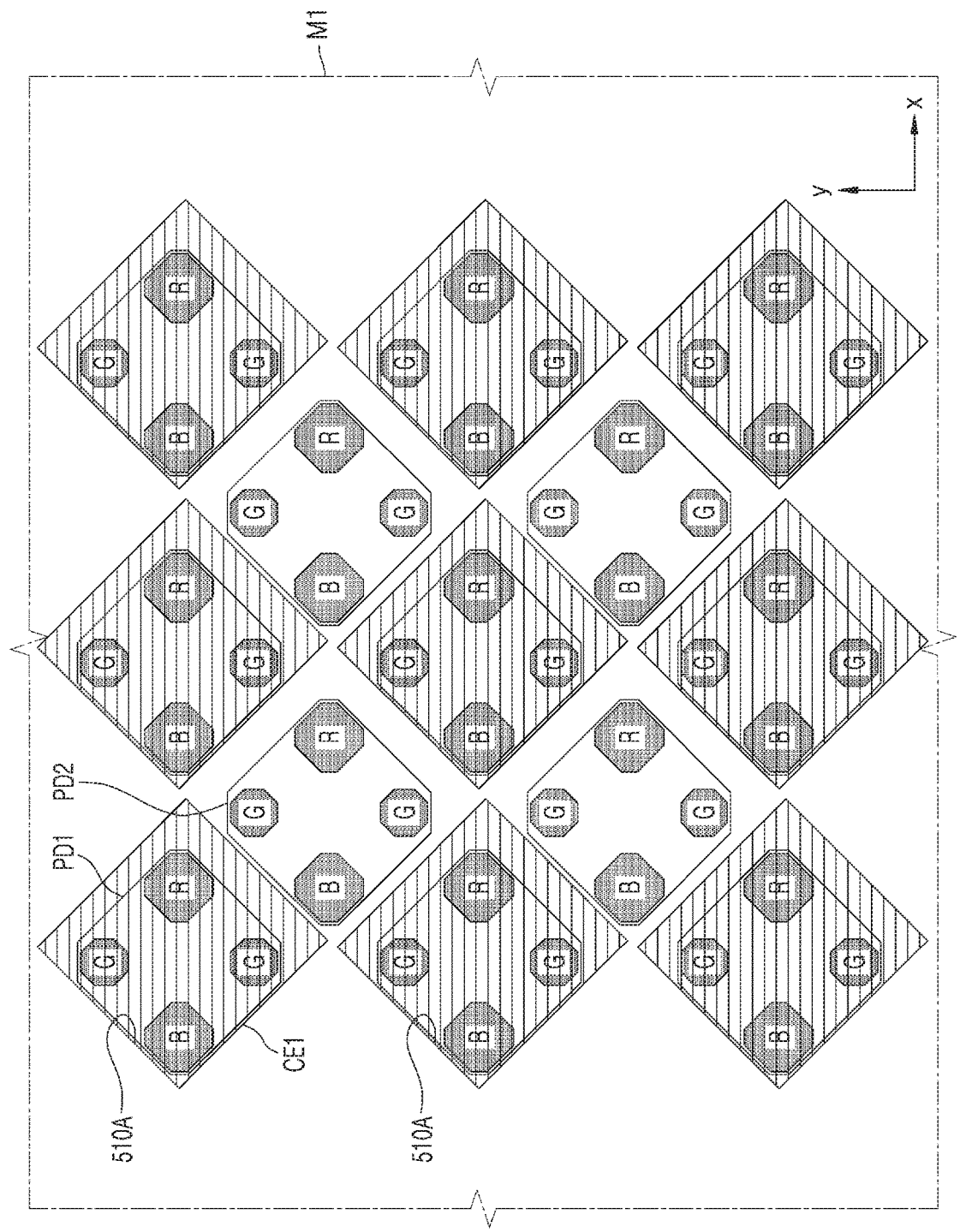
FIG. 9A is a plan view of a manufacturing method of forming an opposite electrode in a first display area by using a first mask.
Figure 9B:
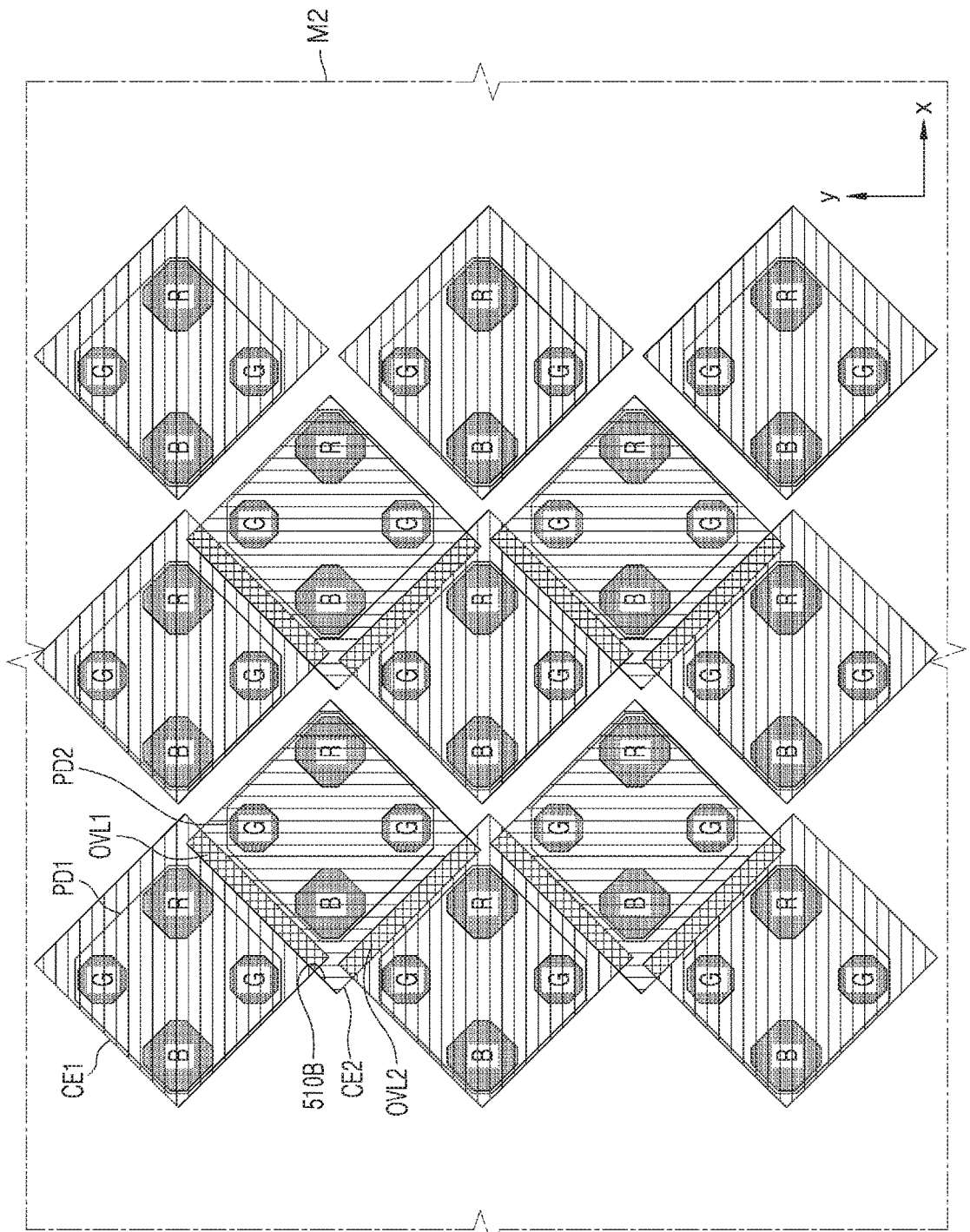
FIG. 9B is a plan view of a manufacturing method of forming an opposite electrode in a first display area by using a second mask.

FIG. 8A is a plan view of an example of a first mask M1 for forming an opposite electrode in the first display area DA1 according to an embodiment, and FIG. 8B is a plan view of an example of a second mask M2 for forming an opposite electrode in the first display area DA1 according to an embodiment. FIGS. 9A and 9B show a manufacturing method using this.

Since the same reference numerals as those of FIG. 5A denote the same members, repeated description thereof is omitted.

Referring to FIG. 8A, the first mask M1 according to an embodiment includes first openings 510A apart from each other, and the first openings 510A may be tilted quadrangles.

The first openings 510A may be spaced apart from each other. A first separation distance dis1 between centers of the first openings 510A apart from each other in the first direction may be the same as a second separation distance dis2 between centers of the first openings 510A apart from each other in the second direction. Therefore, the first openings 510A may be spaced apart from each other with a constant interval.

Referring to FIG. 8B, the second mask M2 according to an embodiment includes second openings 510B apart from each other, and the second openings 510B may be tilted quadrangles.

The second openings 510B may be spaced apart from each other. A third separation distance dis3 between centers of the second openings 510B apart from each other in the first direction may be the same as a fourth separation distance dis4 between centers of the second openings 510B apart from each other in the second direction. Therefore, the second openings 510B may be spaced apart from each other with a constant interval.

The first mask M1 and the second mask M2 according to the present embodiment are masks used for depositing an opposite electrode and may be fine metal masks (FMM). An FMM may be manufactured by forming a hole in a metal plate and then applying tension.

The first openings 510A are intended for forming the first opposite electrodes CE1, and a size of the first openings 510A may be equal to or less than those of the first opposite electrodes CE1. The second openings 510B are intended for forming the second opposite electrodes CE2, and a size of the second openings 510B may be equal to or less than those of the second opposite electrodes CE2.

In the present embodiment, to form the opposite electrode, deposition using the first mask M1 and the second mask M2 may be used. FIG. 9A shows a method of depositing the first opposite electrodes CE1 in the first display area DA1 by using the first mask M1. FIG. 9B shows a method of depositing the second opposite electrodes CE2 in the first display area DA1 by using the second mask M2.

Referring to FIG. 9A, up to the second functional layer 222c (see FIG. 6A) is formed over the substrate 100, and then the first opening 510A may be arranged to correspond to the first pixel area PD1.

Next, the first opposite electrodes CE1 are primarily deposited on the second functional layer 222c by discharging deposition materials to be formed as the opposite electrodes using a deposition source (not shown). In this case, only some of the first opposite electrodes CE1 are formed according to the arrangement of the first openings 510A of the first mask M1.

Next, as shown in FIG. 9B, the second mask M2 is arranged to correspond to the second pixel area PD2, and then the second opposite electrodes CE2 are secondarily deposited. Some regions of the second opposite electrodes CE2 that are formed during the secondary deposition may overlap the first opposite electrodes CE1 that are formed during the primary deposition to constitute the overlapping portion OVL.

However, the embodiment is not limited thereto and the opposite electrode may be formed as one body in the first display area DA1 by using the first mask M1. For example, openings may be arranged in the first mask M1 so as to correspond to the first display area DA1 to form the opposite electrodes, and shielding portions may be arranged in the second mask M2 so as to correspond to the first display area DA1. Various modifications may be made.

Figure 10A:
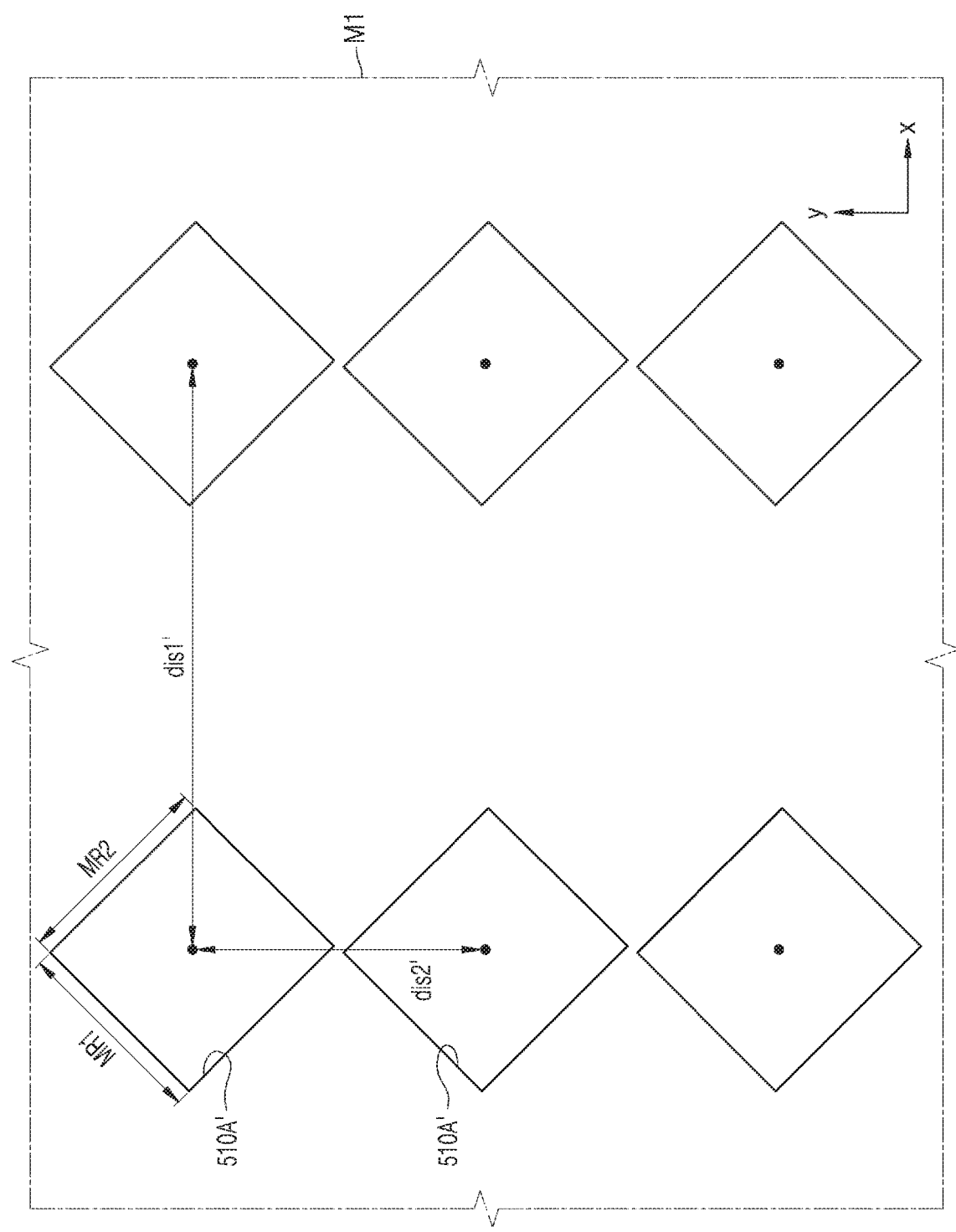
FIG. 10A is a plan view of an example of a first mask for forming an opposite electrode in a second display area according to an embodiment.
Figure 10B:
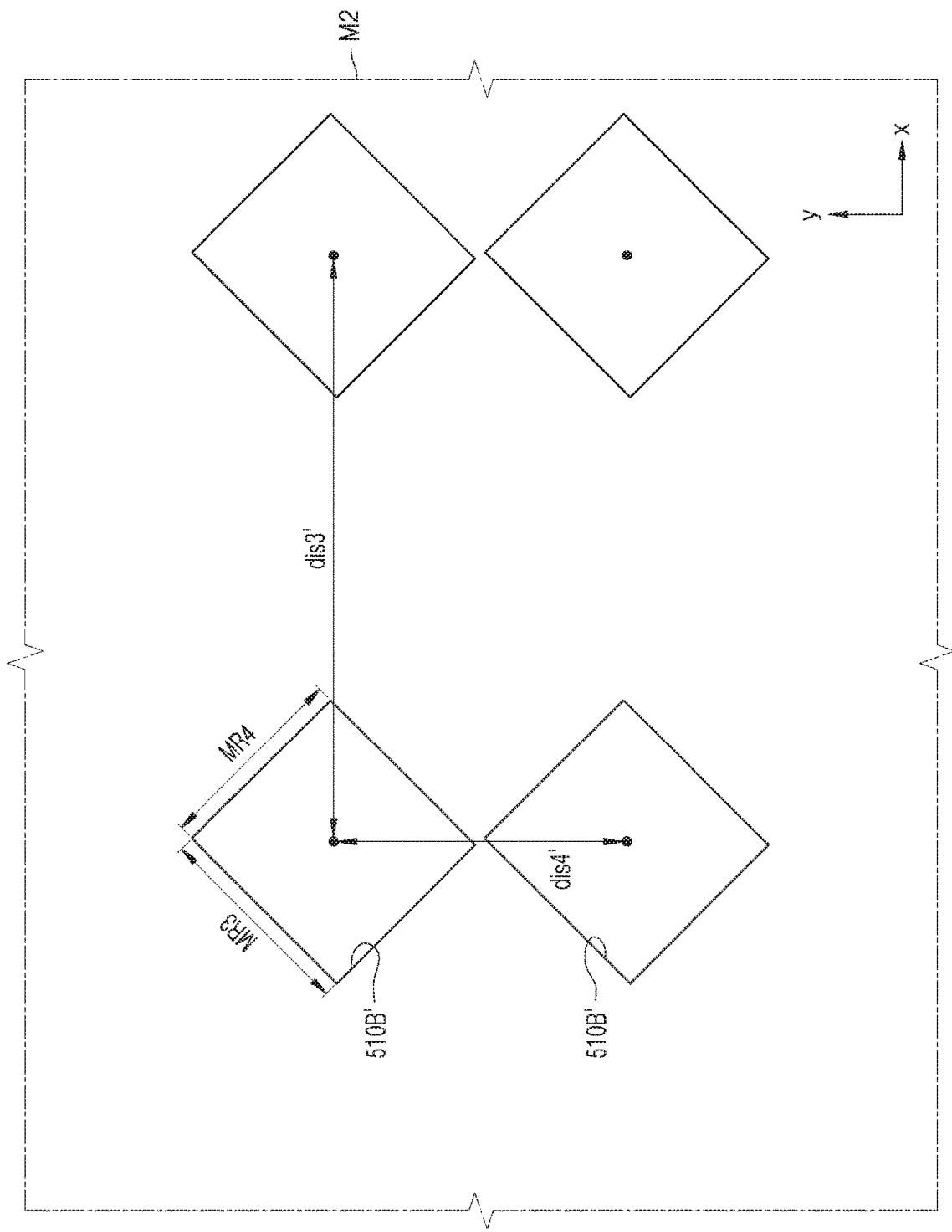
FIG. 10B is a plan view of an example of a second mask for forming an opposite electrode in a second display area according to an embodiment.
Figure 11B:
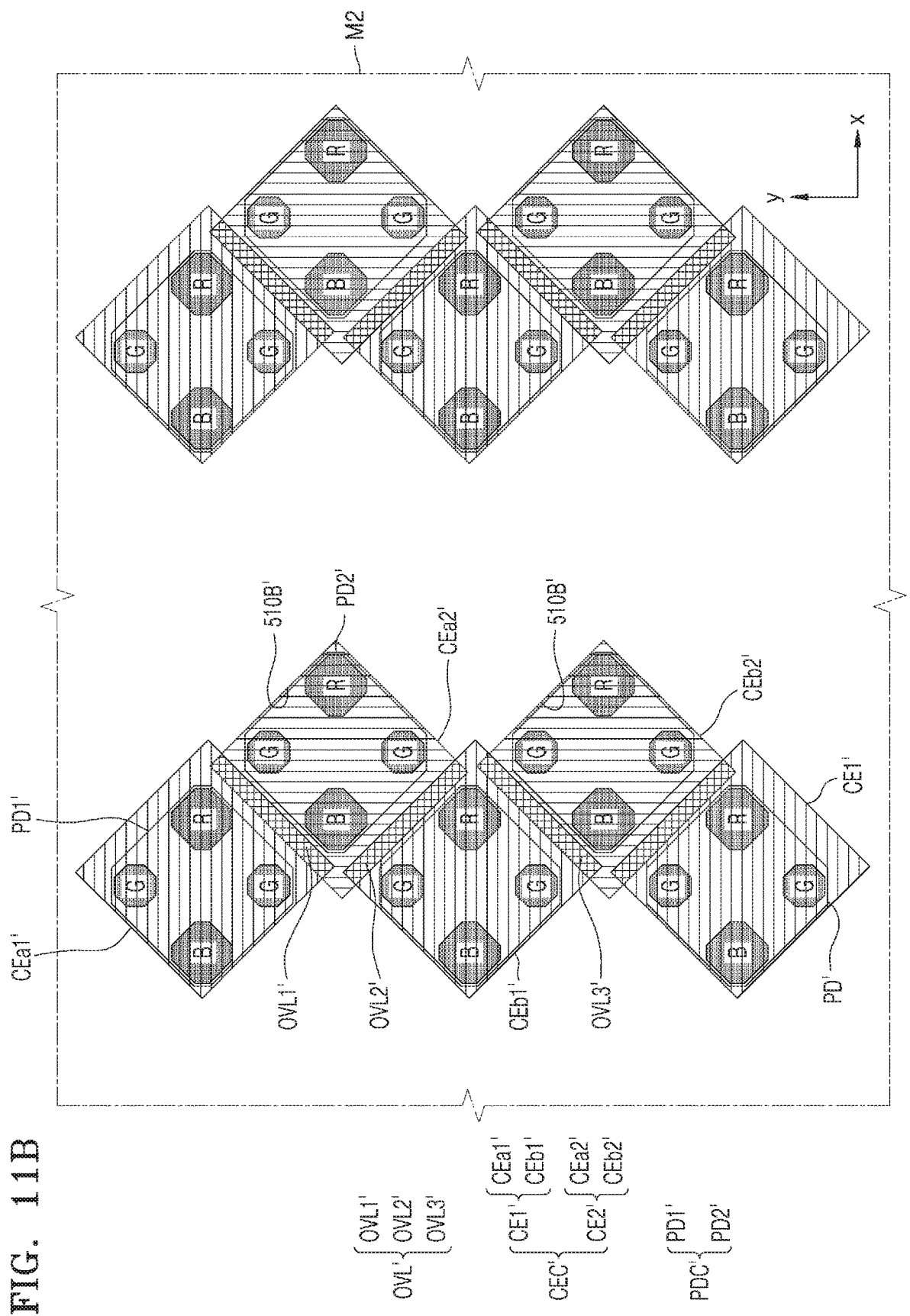
FIG. 11B is a plan view of a manufacturing method of forming an opposite electrode in a second display area by using a second mask according to an embodiment.

FIG. 10A shows an example of the first mask M1 for forming an opposite electrode in the second display area DA2 according to an embodiment, and FIG. 10B shows an example of the second mask M2 for forming an opposite electrode in the second display area DA2 according to an embodiment. FIGS. 11A and 11B show a manufacturing method using this.

Since the same reference numerals as those of FIG. 5B denote the same members, repeated description thereof is omitted.

Referring to FIG. 10A, the first mask M1 according to an embodiment includes first openings 510A' apart from each other.

The first openings 510A' may be quadrangles in a plan view. However, the embodiment is not limited thereto and the first openings 510A' may be circles, triangles, or pentagons. Various modifications may be made. Also, a vertex portion of the quadrangular shape may have a curvature radius.

The first openings 510A' may be rectangles including a short side MR1 and a long side MR2. An extension line of the short side MR1 or an extension line of the long side MR2 may extend in a direction different from the first direction or the second direction. Therefore, the first opening 510A' may be a tilted rectangle.

The first openings 510A' may be spaced apart from each other. In an embodiment, the first openings 510A' may be spaced apart from each other in the first direction (e.g. the x-direction) or the second direction (e.g. the y-direction). However, the embodiment is not limited thereto and the first openings 510A' may be spaced apart from each other in a direction different from the first direction or the second direction. Various modifications may be made.

A first separation distance dis1' between centers of the first openings 510A' apart from each other in the first direction may be different from a second separation distance dis2' between centers of the first openings 510A' apart from each other in the second direction. For example, the first separation distance dis1' may be greater than the second separation distance dis2'.

Referring to FIG. 10B, the second mask M2 according to an embodiment includes second openings 510B' apart from each other.

The second openings 510B' may be quadrangles in a plan view. However, the embodiment is not limited thereto and the second openings 510B' may be circles, triangles, or pentagons. Various modifications may be made. Also, a vertex portion of the quadrangular shape may have a curvature radius.

The second openings 510B' may be rectangles including a short side MR3 and a long side MR4. An extension line of the short side MR3 or an extension line of the long side MR4 may extend in a direction different from the first direction (e.g. the x-direction) or the second direction (e.g. the y-direction). Therefore, the second opening 510B' may be a tilted rectangle.

The second openings 510B' may be spaced apart from each other. In an embodiment, the second openings 510B' may be spaced apart from each other in the first direction or the second direction. However, the embodiment is not limited thereto and the second openings 510B' may be spaced apart from each other in a direction different from the first direction or the second direction. Various modifications may be made.

A third separation distance dis3' between centers of the second openings 510B' apart from each other in the first direction may be different from a fourth separation distance dis4' between centers of the second openings 510B' apart from each other in the second direction. For example, the third separation distance dis3' may be greater than the fourth separation distance dis4'. Therefore, the opposite electrode may not be formed in a region in which the transmissive area TA is arranged in the first direction.

A shape of the first opening 510A' may be different from a shape of the second opening 510B'. An angle by which a short side MR1 of the first opening 510A' is tilted with respect to the first direction may be different from an angle by which a short side MR3 of the second opening 510B' is tilted with respect to the first direction. Also, a planar area of the first opening 510A' may be different from a planar area of the second opening 510B'.

FIG. 11A shows a method of depositing the first opposite electrodes CE1' in the second display area DA2 by using the first mask M1. FIG. 11B shows a method of depositing the second opposite electrodes CE2' in the second display area DA2 by using the second mask M2.

Referring to FIG. 11A, up to the second functional layer 222c (see FIG. 6A) is formed over the substrate 100, and then the first opening 510A' may be arranged to correspond to the first pixel area PD1'.

Next, the first opposite electrodes CE1' are primarily deposited on the second functional layer 222c by discharging deposition materials to be formed as the opposite electrodes using a deposition source (not shown). In this case, only some of the first opposite electrodes CE1' are formed according to the arrangement of the first openings 510A' of the first mask M1.

Next, as shown in FIG. 11B, the second mask M2 is arranged to correspond to the second pixel area PD2', and then the second opposite electrodes CE2' are secondarily deposited. Some regions of the second opposite electrodes CE2' that are formed during the secondary deposition may overlap the first opposite electrodes CE1' that are formed during the primary deposition to constitute the overlapping portion OVL'.

As described above, when the first mask M1 and the second mask M2 are used, the opposite electrode may not be formed in a region corresponding to the transmissive area TA in the second display area DA2. Therefore, the connection opposite electrode CEC' may be alternately arranged with the transmissive area TA. When the opposite electrodes are formed in the second display area DA2 by using the first mask M1 and the second mask M2, an interval between the first opposite electrodes CE1 that neighbor each other and are arranged in the first direction in the first display area DA1 may be different from an interval between the first opposite electrodes CE1' arranged in the first direction in the second display area DA2.

Figure 12A:
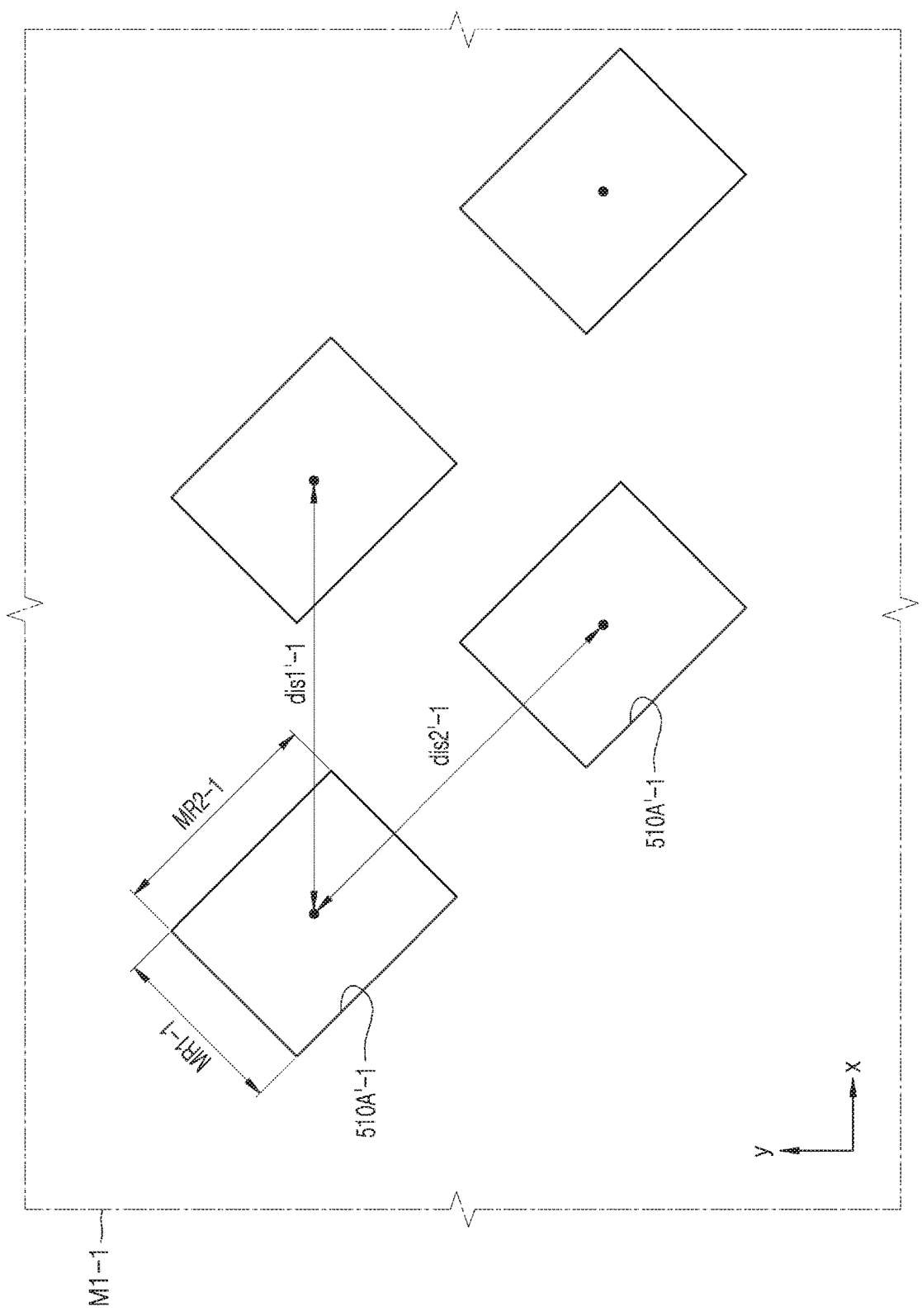
FIG. 12A is a plan view of an example of a first mask for forming an opposite electrode in a second display area according to an embodiment.
Figure 12B:
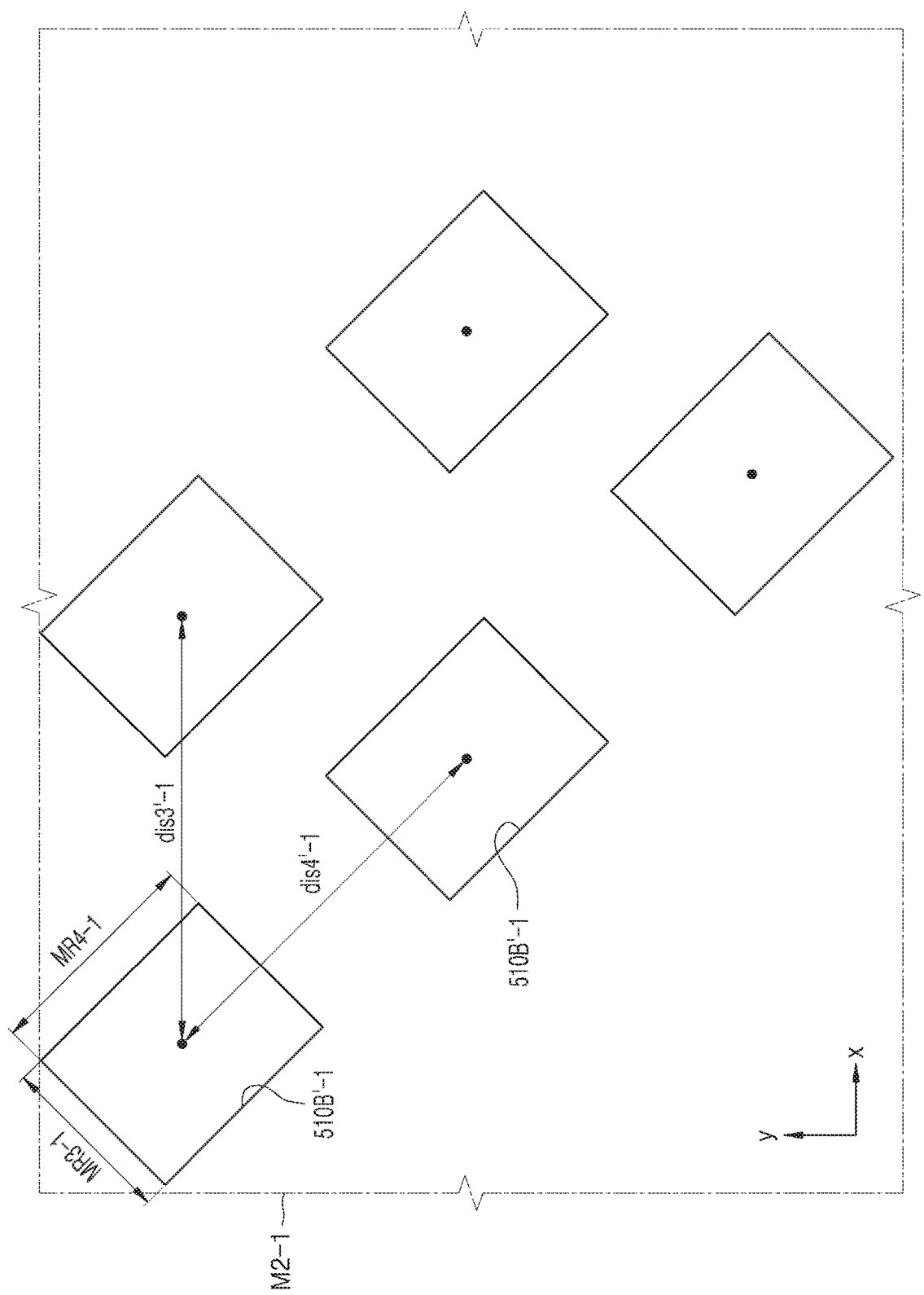
FIG. 12B is a plan view of an example of a second mask for forming an opposite electrode in a second display area according to an embodiment.
Figure 13A:
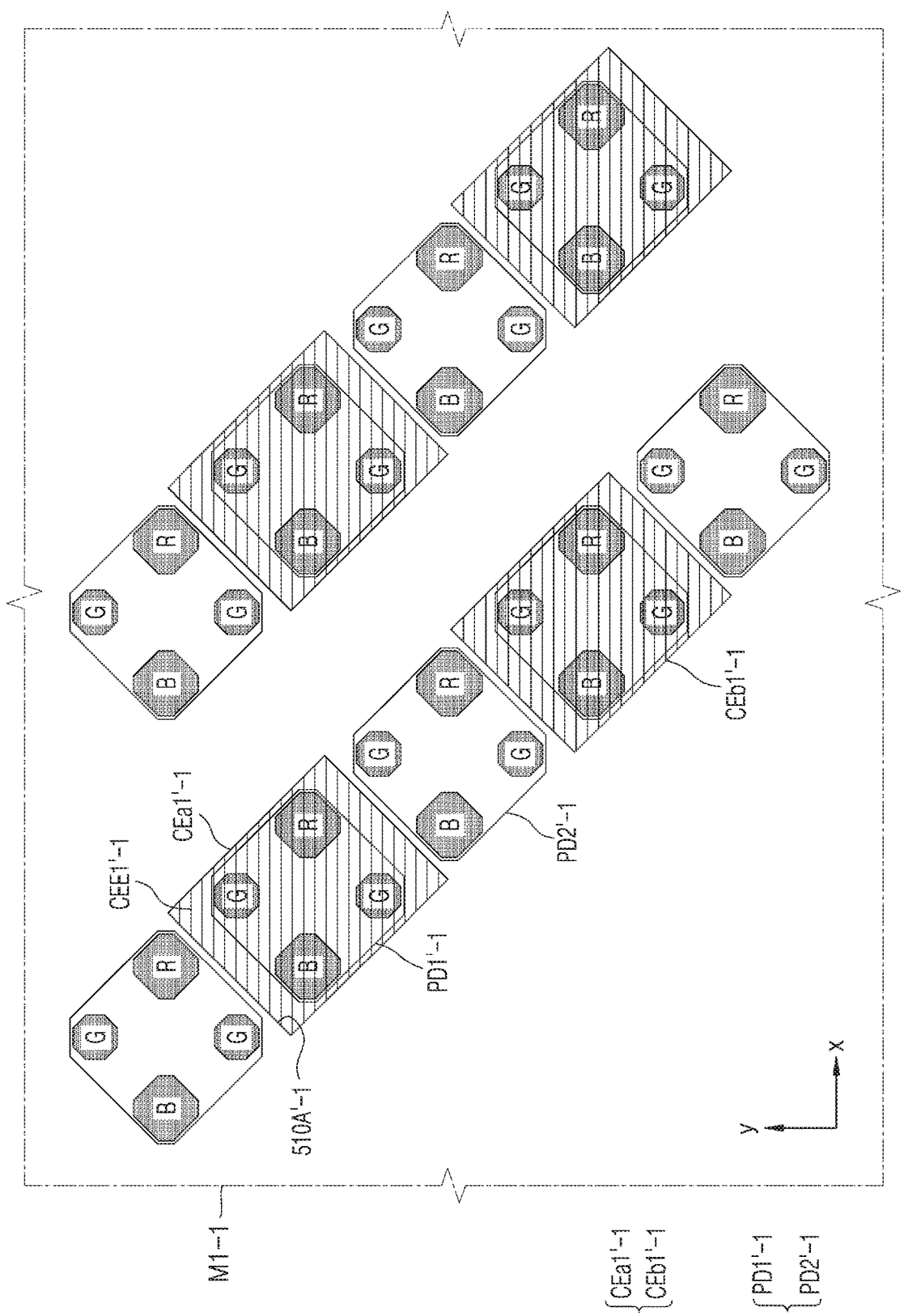
FIG. 13A is a plan view of a manufacturing method of forming an opposite electrode in a second display area by using a first mask according to another embodiment.
Figure 13B:
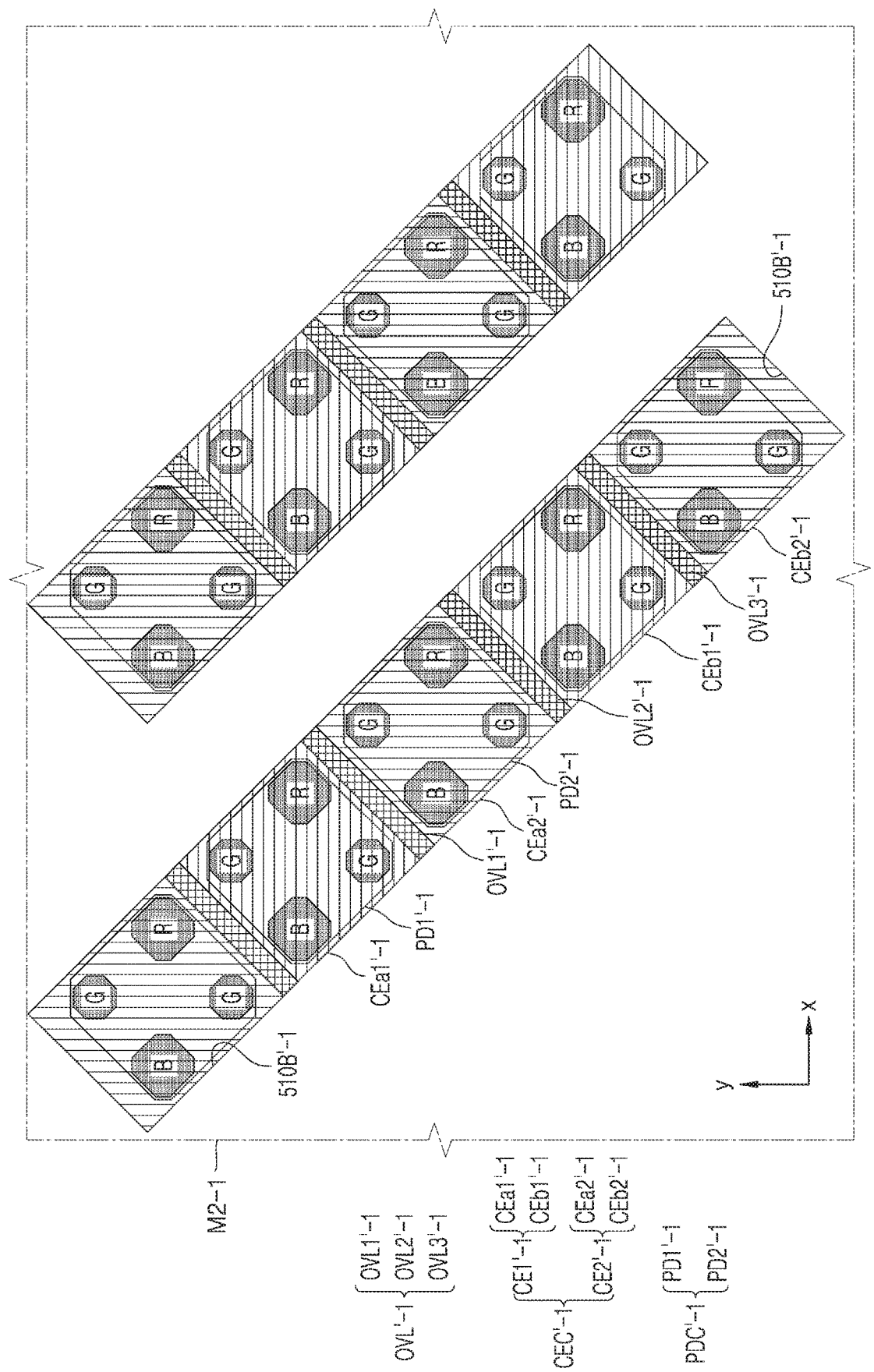
FIG. 13B is a plan view of a manufacturing method of forming an opposite electrode in a second display area by using a second mask according to another embodiment.

FIG. 12A shows an example of a first mask M1-1 for forming an opposite electrode in the second display area DA2 according to an embodiment, and FIG. 12B shows an example of a second mask M2-1 for forming an opposite electrode in the second display area DA2 according to an embodiment. FIGS. 13A and 13B show a manufacturing method using this.

Since the same reference numerals as those of FIG. 7 denote the same members, repeated description thereof is omitted.

Referring to FIG. 12A, the first mask M1-1 according to an embodiment includes first openings 510N-1 apart from each other.

The first openings 510N-1 may be quadrangles in a plan view. Also, a vertex portion of the planar quadrangular shape of the first openings 510N-1 may have a curvature radius.

The first openings 510N-1 may be rectangles including a short side MR1-1 and a long side MR2-1. An extension line of the short side MR1-1 or an extension line of the long side MR2-1 may extend in a direction different from the first direction (e.g. the x-direction) or the second direction (e.g. the y-direction). Therefore, the first opening 510N-1 may be a tilted rectangle.

The first openings 510N-1 may be spaced apart from each other. In an embodiment, the first openings 510N-1 may be spaced apart from each other in the first direction. Also, the first openings 510A'-1 may be spaced apart from each other in a direction different from the first direction and the second direction. For example, the first openings 510A'-1 may be spaced apart from each other by a constant angle tilted from the first direction.

A first separation distance dis1'-1 between centers of the first openings 510N-1 apart from each other in the first direction may be different from a second separation distance dis2'-1 between centers of the first openings 510N-1 apart from each other by a constant angle tilted from the first direction. For example, the first separation distance dis1'-1 may be greater than the second separation distance dis2'-1.

Referring to FIG. 12B, the second mask M2-1 according to another embodiment includes second openings 510B-1 apart from each other.

The second openings 510B-1 may be quadrangles in a plan view. Also, a vertex portion of the planar quadrangular shape of the second openings 510B'-1 may have a curvature radius.

The first openings 510B'-1 may be rectangles including a short side MR3-1 and a long side MR4-1. An extension line of the short side MR3-1 or an extension line of the long side MR4-1 may extend in a direction different from the first direction (e.g. the x-direction) or the second direction (e.g. the y-direction). Therefore, the second opening 510B-1 may be a tilted rectangle.

The second openings 510B'-1 may be spaced apart from each other. In an embodiment, the second openings 510B'-1 may be spaced apart from each other in the first direction. Also, the second openings 510B-1 may be spaced apart from each other in a direction different from the first direction and the second direction. For example, the second openings 510B'-1 may be spaced apart from each other by a constant angle tilted from the first direction.

A second separation distance dis3'-1 between centers of the second openings 510B'-1 apart from each other in the first direction may be different from a fourth separation distance dis4'-1 between centers of the second openings 510B-1 apart from each other by a constant angle tilted from the first direction. For example, the third separation distance dis3'-1 may be greater than the fourth separation distance dis4'-1.

A shape of the first openings 510N-1 may be the same as a shape of the second openings 510B-1. An angle by which a short side MR1-1 of the first opening 510N-1 is tilted with respect to the first direction may be the same as an angle by which a short side MR3-1 of the second opening 510B-1 is tilted with respect to the first direction. Also, a planar area of the first opening 510N-1 may be the same as a planar area of the second opening 510B-1.

The first mask M1-1 and the second mask M2-1 according to the present embodiment are masks used for depositing an opposite electrode and may be fine metal masks (FMM). An FMM may be manufactured by forming a hole in a metal plate and then applying tension.

In the present embodiment, to form an opposite electrode, deposition is performed by using the first mask M1-1 and the second mask M2-1. FIG. 13A shows a method of depositing the first opposite electrodes CE1'-1 in the second display area DA2 by using the first mask M1-1. FIG. 13B shows a method of depositing the second opposite electrodes CE2'-1 in the second display area DA2 by using the second mask M2-1.

Since a method of forming the first opposite electrodes CE1'-1 and the second opposite electrodes CE2'-1 is the same as that described in FIGS. 11A and 11B, description thereof is omitted.

The first overlapping portion OVL1'-1 and the second overlapping portion OVL2'-1 may be formed by using the above manufacturing method, and an extension line of the first overlapping portion OVL1'-1 in a lengthwise direction may be parallel to an extension line of the second overlapping portion OVL2'-1 in a lengthwise direction. Therefore, an opposite electrode disconnection phenomenon in the second display area DA2 may be prevented.

A display device according to embodiments may provide an environment in which a component may operate by arranging a pixel area and a transmissive area having an improved light transmittance in a sensor area corresponding to the component such as a sensor, and simultaneously display an image in an area overlapping the component.

Therefore, a display device having various functions and improving quality may be provided. However, this effect is provided as an example, and effects corresponding to embodiments are described in detail through description below.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A display device comprising:
   a substrate including a first display area and a second display area, the second display area including transmissive areas and electrode layers;
   first opposite electrodes disposed apart from a light emission layer and spaced apart from each other over the substrate; and second opposite electrodes including overlapping portions that overlap the first opposite electrodes over the substrate, the second opposite electrodes being disposed apart from the light emission layer and spaced apart from each other, wherein each of the first opposite electrodes is connected to each of the second opposite electrodes by the overlapping portion in the first display area and second display area, and each of the first opposite electrodes and each of the second opposite electrodes are alternately arranged with the transmissive areas respectively in the second display area, wherein each of the first opposite electrodes only includes a first pixel area including a plurality of sub-pixels, and an area of each of the first opposite electrodes is larger than an area of the first pixel area, wherein each of the second opposite electrodes only includes a second pixel area neighboring the first pixel area and including a plurality of sub-pixels, and an area of each of the second opposite electrodes is larger than an area of the second pixel area, wherein each of the plurality of sub-pixels in the first and second display areas further includes a pixel electrode, a first functional layer, and the light emission layer, the first functional layers in the plurality of sub-pixels not overlapping each other in the second display area, and a second functional layers in the plurality of sub-pixels not overlapping each other in the second display area, wherein the electrode layers are disposed in the second display area, but not in the first display area, and each of the electrode layers is connected to a wiring disposed on an insulation layer through a first contact hole extending through the insulation layer, and wherein the wiring connected to each of the electrode layers is disposed on a same layer as a gate electrode disposed in each of the plurality of sub-pixels in the second display area and is spaced apart from the gate electrode along a horizontal direction.

2. The display device of claim 1, wherein
the overlapping portion includes a first overlapping portion and a second overlapping portion,
a first central opposite electrode, which is one of the first opposite electrodes, overlaps a second central opposite electrode, which is one of the second opposite electrodes, in the first overlapping portion, and
the second central opposite electrode overlaps a first peripheral opposite electrode, which is another of the first opposite electrodes, in the second overlapping portion.

3. The display device of claim 2, wherein
an extension line of the first overlapping portion in a lengthwise direction intersects with an extension line of the second overlapping portion in a lengthwise direction.

4. The display device of claim 3, wherein
the first overlapping portion does not contact the second overlapping portion.

5. The display device of claim 2, wherein
an extension line of the first overlapping portion in a lengthwise direction is parallel to an extension line of the second overlapping portion in a lengthwise direction.

6. The display device of claim 2, wherein
the overlapping portion further includes a third overlapping portion, and
the first peripheral opposite electrode overlaps a second peripheral opposite electrode, which is another of the second opposite electrodes, in the third overlapping portion.

7. The display device of claim 1, wherein
the overlapping portion includes a second overlapping portion and a third overlapping portion,
a second central opposite electrode, which is one of the second opposite electrodes, overlaps a first peripheral opposite electrode, which is one of the first opposite electrodes, in the second overlapping portion, and
the first peripheral opposite electrode overlaps a second peripheral opposite electrode, which is another of the second opposite electrodes, in the third overlapping portion.

8. The display device of claim 1, wherein
the first pixel area and the second pixel area constitute a virtual quadrangle,
the plurality of sub-pixels include a first sub-pixel, a second sub-pixel, and a third sub-pixel emitting light of different colors, and are respectively arranged at vertexes of the virtual quadrangle, and
the second sub-pixels face each other around a center of the virtual quadrangle.

9. The display device of claim 1, wherein
the first pixel area and the second pixel area constitute a virtual quadrangle,
the plurality of sub-pixels include a first sub-pixel, a second sub-pixel, and a third sub-pixel emitting light having different colors, and are respectively arranged at vertexes of the virtual quadrangle, and
the first sub-pixel faces the third sub-pixel around a center of the virtual quadrangle.

10. The display device of claim 1, wherein
an interval between the first opposite electrodes neighboring each other and arranged in a first direction in the first display area is different from an interval between the first opposite electrodes neighboring each other and arranged in the first direction in the second display area.

* * * * *